United States Patent
Liao et al.

(10) Patent No.: US 9,812,363 B1
(45) Date of Patent: Nov. 7, 2017

(54) FINFET DEVICE AND METHOD OF FORMING SAME

(71) Applicant: Taiwan Semiconductor Manufacturing Company, Ltd., Hsin-Chu (TW)

(72) Inventors: Chih-Teng Liao, Hsin-Chu (TW); Chih-Shan Chen, New Taipei (TW); Yi-Wei Chiu, Kaohsiung (TW); Ying Ting Hsia, Kaohsiung (TW); Tzu-Chan Weng, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/436,568

(22) Filed: Feb. 17, 2017

Related U.S. Application Data

(60) Provisional application No. 62/427,571, filed on Nov. 29, 2016.

(51) Int. Cl.
| | |
|---|---|
| *H01L 21/8232* | (2006.01) |
| *H01L 21/8234* | (2006.01) |
| *H01L 29/66* | (2006.01) |
| *H01L 29/78* | (2006.01) |
| *H01L 29/06* | (2006.01) |
| H01L 29/417 | (2006.01) |
| H01L 27/088 | (2006.01) |

(52) U.S. Cl.
CPC ........ *H01L 21/823418* (2013.01); *H01L 21/823431* (2013.01); *H01L 21/823481* (2013.01); *H01L 29/0649* (2013.01); H01L 29/66545 (2013.01); *H01L 29/7851* (2013.01); H01L 27/0886 (2013.01); H01L 29/41783 (2013.01); H01L 29/41791 (2013.01)

(58) Field of Classification Search
CPC ..... H01L 21/823821; H01L 21/823418; H01L 27/0886; H01L 29/41791; H01L 29/41783; H01L 29/66545
USPC .......................................... 257/331; 438/284
See application file for complete search history.

(56) References Cited

U.S. PATENT DOCUMENTS

| | | | |
|---|---|---|---|
| 7,667,271 | B2 | 2/2010 | Yu et al. |
| 8,362,575 | B2 | 1/2013 | Kwok et al. |
| 8,367,498 | B2 | 2/2013 | Chang et al. |
| 8,440,517 | B2 | 5/2013 | Lin et al. |
| 8,497,528 | B2 | 7/2013 | Lee et al. |
| 8,610,240 | B2 | 12/2013 | Lee et al. |
| 8,680,576 | B2 | 3/2014 | Ching et al. |
| 8,723,272 | B2 | 5/2014 | Liu et al. |
| 8,729,627 | B2 | 5/2014 | Cheng et al. |

(Continued)

*Primary Examiner* — George Fourson, III
(74) *Attorney, Agent, or Firm* — Slater Matsil, LLP

(57) ABSTRACT

A FinFET device and a method of forming the same are provided. A method includes forming a fin over a substrate. An isolation region is formed adjacent the fin. A dummy gate structure is formed over the fin. The fin adjacent the dummy gate structure is recessed to form a first recess. The first recess has a U-shaped bottom surface. The U-shaped bottom surface is below a top surface of the isolation region. The first recess is reshaped to form a reshaped first recess. The reshaped first recess has a V-shaped bottom surface. At least a portion of the V-shaped bottom surface comprises one or more steps. A source/drain region is epitaxially grown in the reshaped first recess.

20 Claims, 48 Drawing Sheets

(56) References Cited

U.S. PATENT DOCUMENTS

| | | | |
|---|---|---|---|
| 8,729,634 B2 | 5/2014 | Shen et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 9,450,047 B1* | 9/2016 | Liao | H01L 29/0847 |
| 2011/0068407 A1 | 3/2011 | Yeh et al. | |
| 2011/0073952 A1* | 3/2011 | Kwok | H01L 29/045 257/368 |
| 2013/0011983 A1 | 1/2013 | Tsai et al. | |
| 2014/0131776 A1* | 5/2014 | Ching | H01L 29/66545 257/288 |
| 2014/0252412 A1 | 9/2014 | Tsai et al. | |
| 2014/0264348 A1* | 9/2014 | Tsai | C30B 25/165 257/57 |
| 2014/0361373 A1* | 12/2014 | Hung | H01L 29/7848 257/365 |
| 2015/0364593 A1* | 12/2015 | Jangjian | H01L 29/785 257/401 |
| 2016/0087104 A1* | 3/2016 | Lee | H01L 29/7851 257/192 |
| 2016/0163820 A1* | 6/2016 | Lee | H01L 29/7851 438/283 |
| 2016/0172439 A1* | 6/2016 | Lin | H01L 29/0642 257/401 |
| 2016/0268312 A1* | 9/2016 | Wang | H01L 21/02532 |
| 2016/0308048 A1* | 10/2016 | Ching | H01L 29/7848 |
| 2017/0077302 A1* | 3/2017 | Cheng | H01L 29/7848 |
| 2017/0141189 A1* | 5/2017 | Chang | H01L 29/1083 |
| 2017/0154958 A1* | 6/2017 | Fung | H01L 29/0673 |
| 2017/0154967 A1* | 6/2017 | Huang | H01L 29/41791 |
| 2017/0154991 A1* | 6/2017 | Ko | H01L 29/785 |
| 2017/0162451 A1* | 6/2017 | Pranatharthiharan | H01L 21/823878 |
| 2017/0162580 A1* | 6/2017 | Liaw | H01L 21/0274 |
| 2017/0162584 A1* | 6/2017 | Pranatharthiharan | H01L 27/1104 |
| 2017/0170319 A1* | 6/2017 | Li | H01L 29/7848 |

* cited by examiner

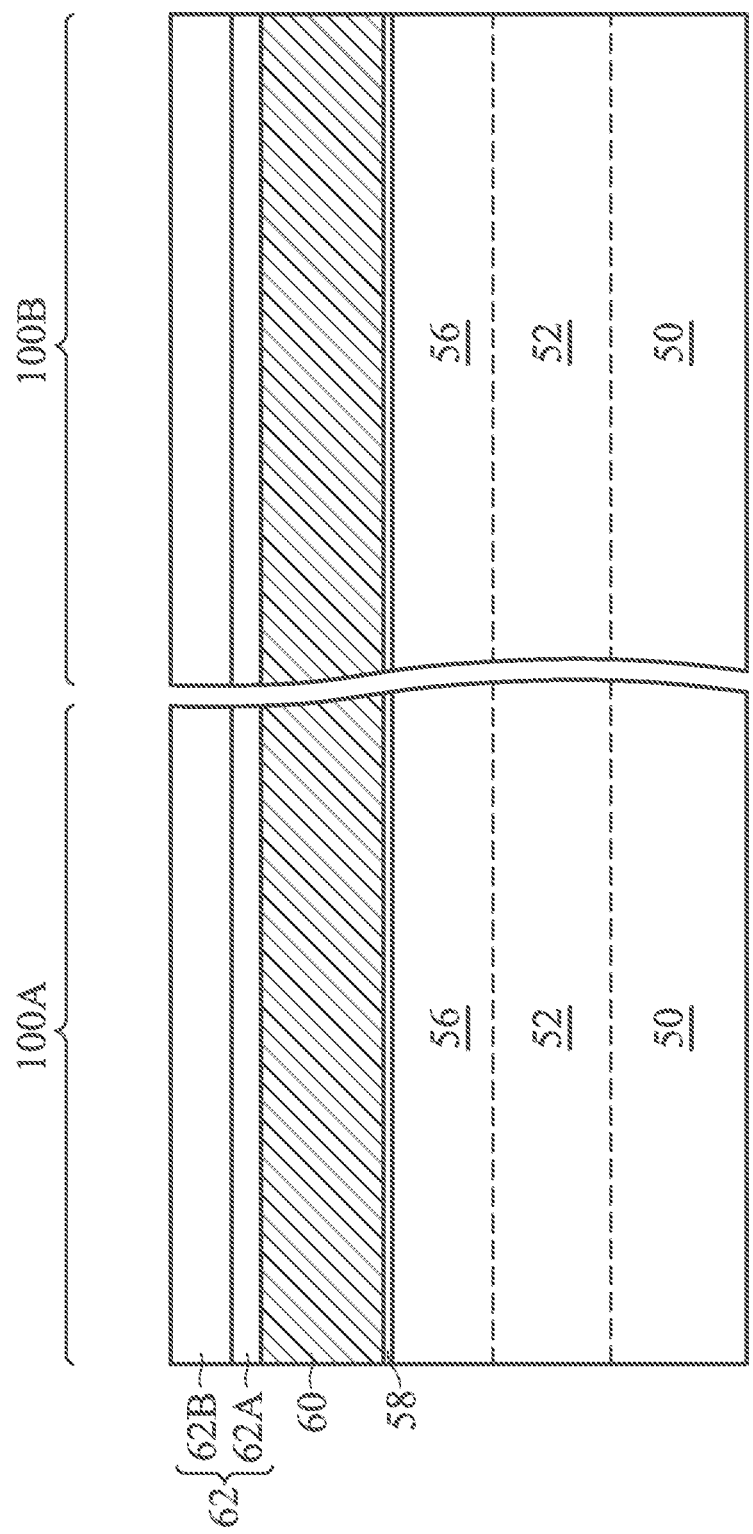

FINFET DEVICE AND METHOD OF FORMING SAME

PRIORITY CLAIM AND CROSS-REFERENCE

This application claims the benefit of U.S. Provisional Application Ser. No. 62/427,571, filed on Nov. 29, 2016, entitled "FinFET Device and Method of Forming Same," which application is hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-5A are cross-sectional views of intermediate stages in the manufacture of a FinFET device in accordance with some embodiments.

FIGS. 6A and 6B are cross-sectional views of intermediate stages in the manufacture of a FinFET device in accordance with some embodiments.

DETAILED DESCRIPTION

Figure 1:
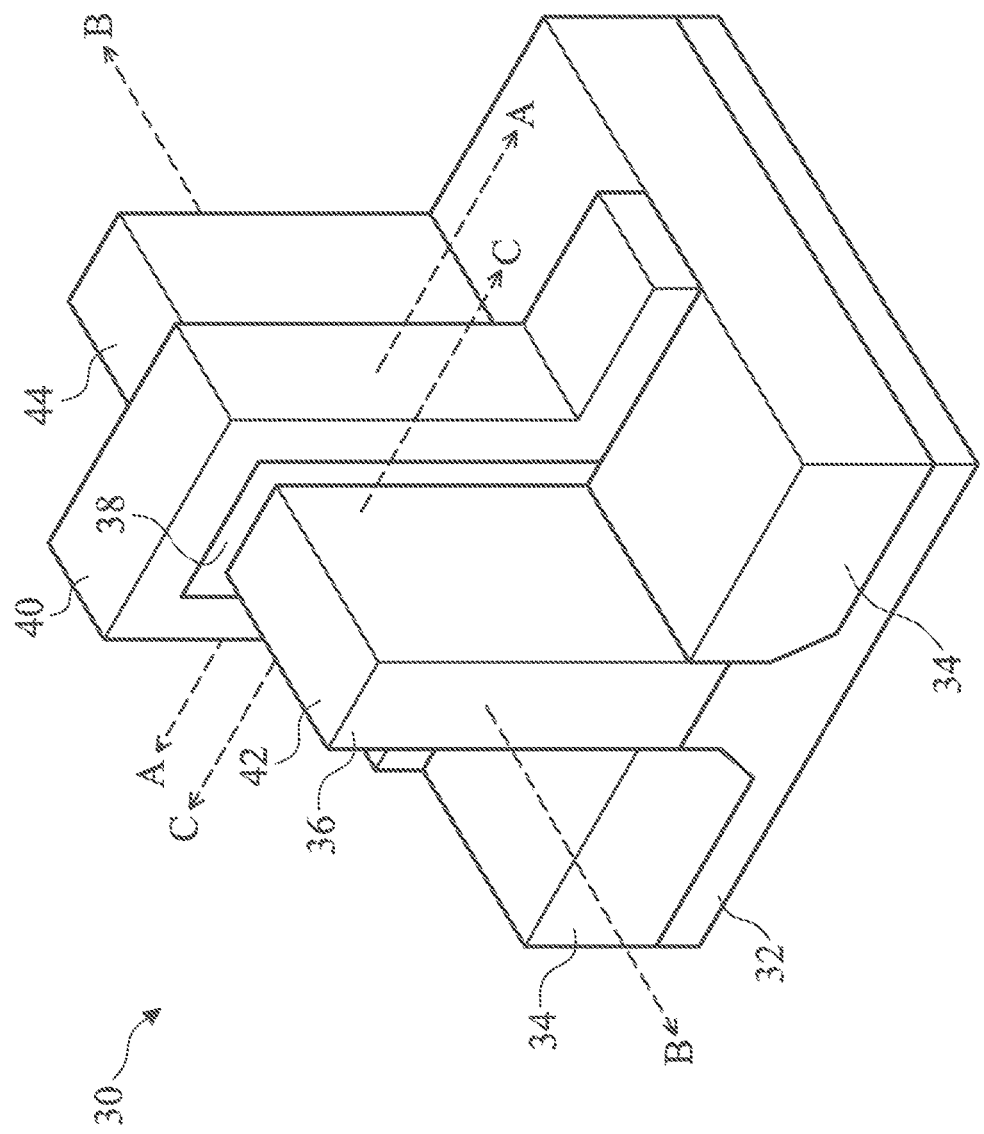
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device and a method of forming the same. Various embodiments discussed herein allow for forming source/drain regions of a FinFET device, such that the number of misfit dislocations in source/drain regions are reduced, thereby preventing the relaxation of the source/drain regions through the formation of misfit dislocations. Various embodiments presented herein are discussed in the context of FinFETs formed using a gate-last process. In other embodiments, a gate-first process may be used. Also, some embodiments contemplate aspects used in planar devices, such as planar FETs.

FIG. 1 illustrates an example of a fin field-effect transistor (FinFET) 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in subsequent figures. Cross-section A-A is across a channel, gate dielectric 38, and gate electrode 40 of the FinFET 30. Cross-section C-C is in a plane that is parallel to cross section A-A and is across fin 36 outside of the channel. Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

FIGS. 2A through 18A-C are cross-sectional views of intermediate stages in the manufacturing of FinFETs in accordance with some embodiment. In FIGS. 2A through 18A-C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1.

Figure 2A:
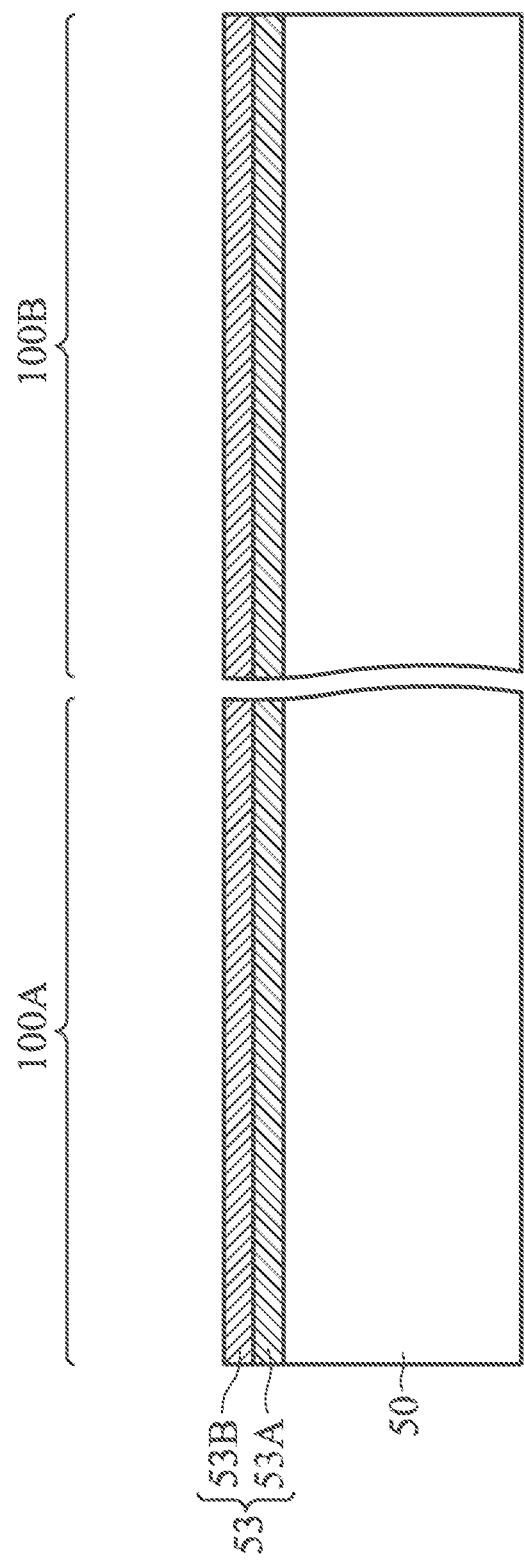

FIG. 2A illustrates a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may further include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the resulting FinFETs. The integrated circuit devices may be formed using any suitable methods.

In some embodiments, the substrate 50 may comprise a first region 100A and a second region 100B. The first region 100A can be for forming n-type devices, such as NMOS transistors, such as n-type FinFETs. The second region 100B can be for forming p-type devices, such as PMOS transistors, such as p-type FinFETs. Accordingly, the first region 100A may be also referred to as an NMOS region 100A, and the second region 100B may be also referred to as a PMOS region 100B.

FIG. 2A further illustrates the formation of a mask 53 over the substrate 50. In some embodiments, the mask 53 may be used in a subsequent etching step to pattern the substrate 50 (See FIG. 3A). As shown in FIG. 2A, the mask 53 may include a first mask layer 53A and a second mask layer 53B. The first mask layer 53A may be a hard mask layer, may comprise silicon nitride, silicon oxynitride, silicon carbide, silicon carbonitride, a combination thereof, or the like, and may be formed using any suitable process, such as atomic layer deposition (ALD), physical vapor deposition (PVD), chemical vapor deposition (CVD), a combination thereof, or the like. The first mask layer 53A may be used to prevent or minimize etching of the substrate 50 underlying the first mask layer 53A in the subsequent etch step (See FIG. 3A). The second mask layer 53B may comprise photoresist, and in some embodiments, may be used to pattern the first mask layer 53A for use in the subsequent etching step discussed above. The second mask layer 53B may be formed by using a spin-on technique and may be patterned using acceptable photolithography techniques. In some embodiments, the mask 53 may comprise three or more mask layers.

Figure 3A:
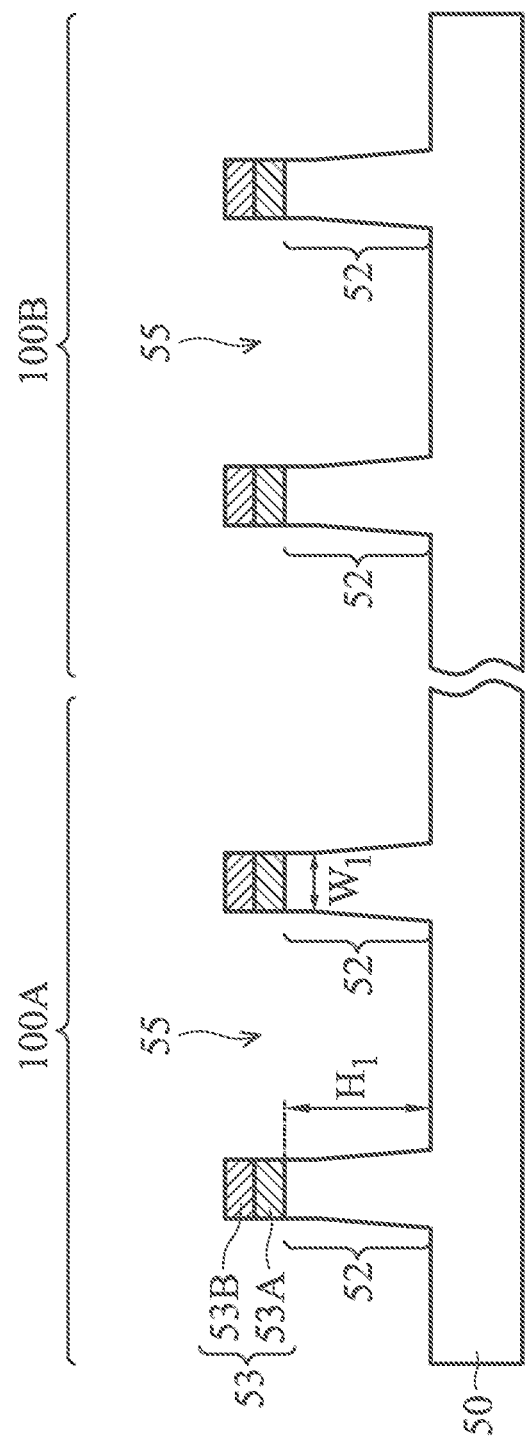

FIG. 3A illustrates the formation of semiconductor strips 52 in the substrate 50. First, mask layers 53A and 53B may be patterned, where openings in mask layers 53A and 53B expose areas of the substrate 50 where trenches 55 will be formed. Next, an etching process may be performed, where the etching process creates the trenches 55 in the substrate 50 through the openings in the mask 53. The remaining portions of the substrate 50 underlying a patterned mask 53 form a plurality of semiconductor strips 52. The etching may be any acceptable etch process, such as a reactive ion etch (RIE), neutral beam etch (NBE), the like, or a combination thereof. The etch process may be anisotropic. In some embodiments, the semiconductor strips 52 may have a height $H_1$ between about 50 nm and about 60 nm, and a width $W_1$ between about 6 nm and about 8 nm.

Figure 4A:
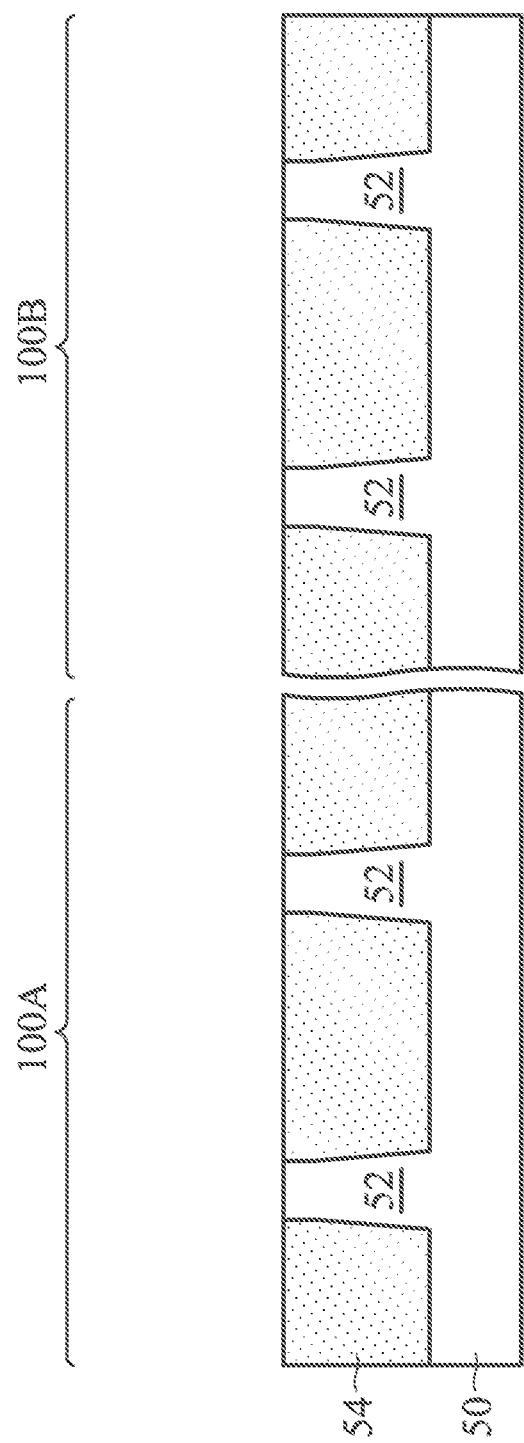

FIG. 4A illustrates the formation of an insulation material in the trenches 55 (see FIG. 3A) between neighboring semiconductor strips 52 to form isolation regions 54. The insulation material may be an oxide, such as silicon oxide, a nitride, such as silicon nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable processes may be also used.

Furthermore, in some embodiments, the isolation regions 54 may include a conformal liner (not illustrated) formed on sidewalls and a bottom surface of the trenches 55 (see FIG. 3A) prior to the filling of the trenches 55 with an insulation material of the isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, or the like. The formation of the liner may include any suitable method, such as ALD, CVD, HDP-CVD, PVD, a combination thereof, or the like. In such embodiments, the liner may prevent (or at least reduce) the diffusion of the semiconductor material from the semiconductor strips 52 (e.g., Si and/or Ge) into the surrounding isolation regions 54 during the subsequent annealing of the isolation regions 54. For example, after the insulation material of the isolation regions 54 are deposited, an annealing process may be performed on the insulation material of the isolation regions 54.

Referring further to FIG. 4A, a planarization process, such as a chemical mechanical polishing (CMP), may remove any excess insulation material of the isolation regions 54, such that top surfaces of the isolation regions 54 and top surfaces of the semiconductor strips 52 are coplanar. In some embodiments, the CMP may also remove the mask 53. In other embodiments, the mask 53 may be removed using a wet cleaning process separate from the CMP.

Figure 5A:
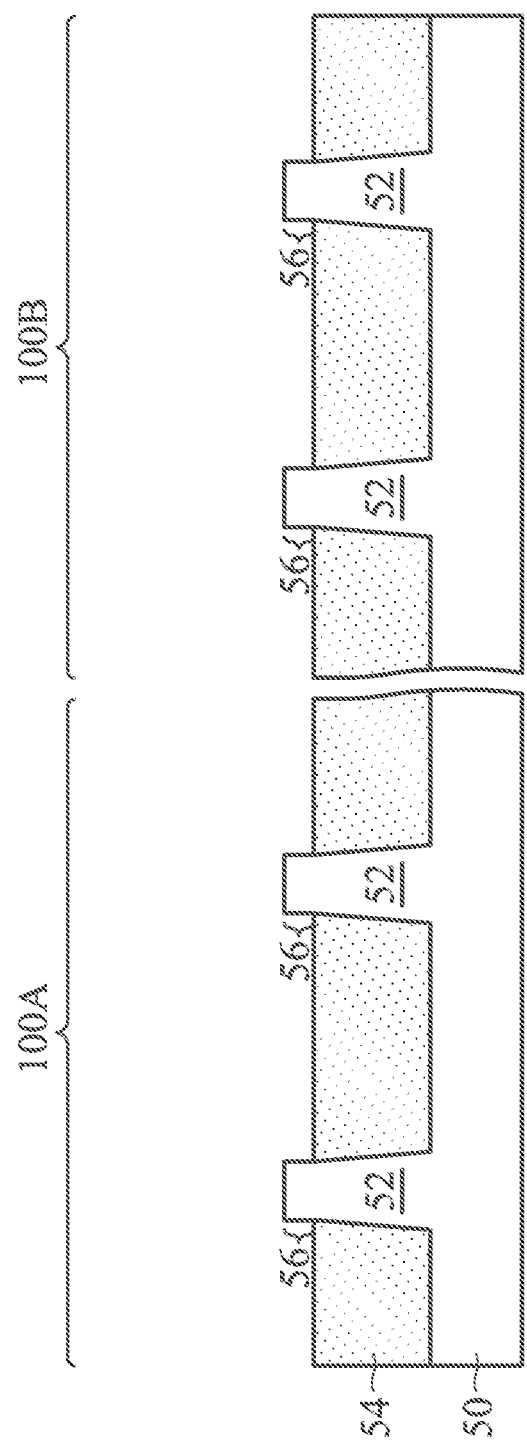

FIG. 5A illustrates the recessing of the isolation regions 54 to form Shallow Trench Isolation (STI) regions 54. The isolation regions 54 are recessed such that fins 56 in the first region 100A and in the second region 100B protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch, an Applied Materials SICONI tool, or dilute hydrofluoric (dHF) acid may be used.

A person having ordinary skill in the art will readily understand that the process described with respect to FIGS. 2A through 5A is just one example of how the fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In yet other embodiments, heteroepitaxial structures can be used for the fins. For example, the semiconductor strips 52 in FIG. 4A can be recessed, and a material different from the semiconductor strips 52 may be epitaxially grown in their place. In even further embodiments, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth. In other embodiments, homoepitaxial or heteroepitaxial structures may be doped using, for example, ion implantation after homoepitaxial or heteroepitaxial structures are epitaxially grown. Still further, it may be advantageous to epitaxially grow a material in the NMOS region 100A different from the material in the PMOS region 100B. In various embodiments, the fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
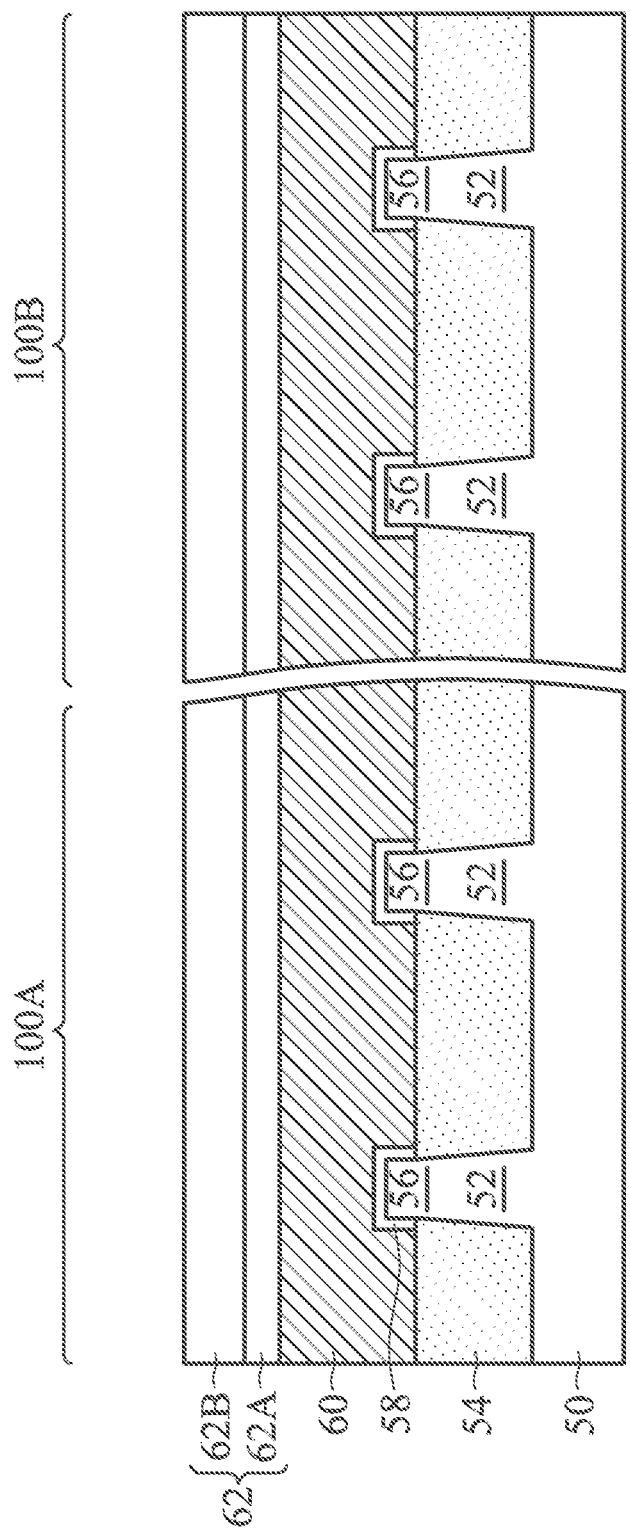

In FIGS. 6A and 6B, a dummy dielectric layer 58 is formed on the fins 56. The dummy dielectric layer 58 may be, for example, silicon oxide, silicon nitride, a combination thereof, or the like, and may be deposited (using, for example, CVD, PVD, a combination thereof, or the like) or thermally grown (for example, using thermal oxidation, or the like) according to acceptable techniques. A dummy gate layer 60 is formed over the dummy dielectric layer 58, and a mask 62 is formed over the dummy gate layer 60. In some embodiments, the dummy gate layer 60 may be deposited over the dummy dielectric layer 58 and then planarized using, for example, a CMP process. The mask 62 may be deposited over the dummy gate layer 60. The dummy gate layer 60 may be made of, for example, polysilicon, although other materials that have a high etching selectivity with respect to the material of the isolation regions 54 may also be used. The mask 62 may include one or more layers of, for example, silicon nitride, silicon oxynitride, silicon carbide, silicon carbonitride, the like, or a combination thereof. In an embodiment, the mask 62 comprises a first mask layer 62A formed of silicon nitride and a second mask layer 62B formed of silicon oxide. In some embodiments, the first mask layer 62A may have a thickness between about 9 nm and about 13 nm, and the second mask layer 62B may have a thickness between about 110 nm and about 130 nm.

Referring further to FIGS. 6A and 6B, in the illustrated embodiment, a single dummy dielectric layer 58, a single dummy gate layer 60, and a single mask 62 are formed across the first region 100A and the second region 100B. In other embodiments, separate dummy dielectric layers, separate dummy gate layers, and separate masks may be formed in the first region 100A and the second region 100B. In some embodiments, the dummy dielectric layer 58 may have a thickness between about 11 nm and about 15 nm, and the dummy gate layer 60 may have a thickness between about 155 nm and about 165 nm. In some embodiments, the dummy dielectric layer 58 may be omitted.

Figure 7A:
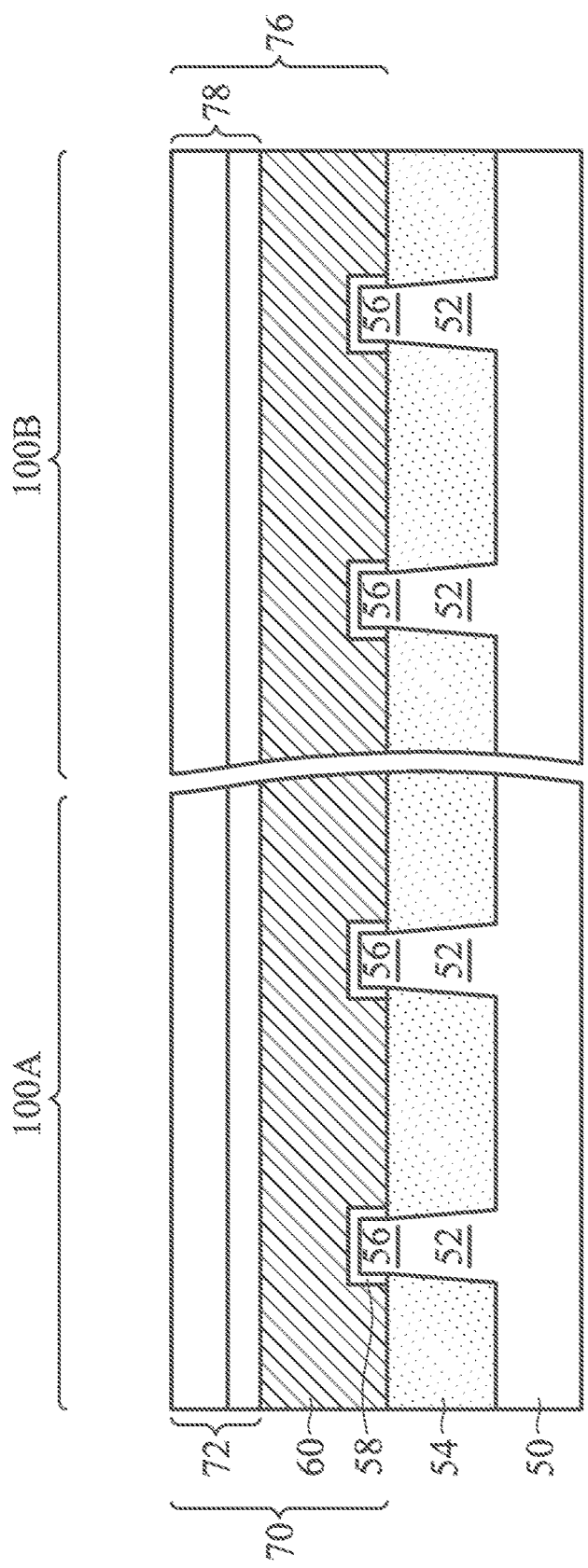
FIGS. 7A, 7B and 7C are cross-sectional views of intermediate stages in the manufacture of a FinFET device in accordance with some embodiments.
Figure 7B:
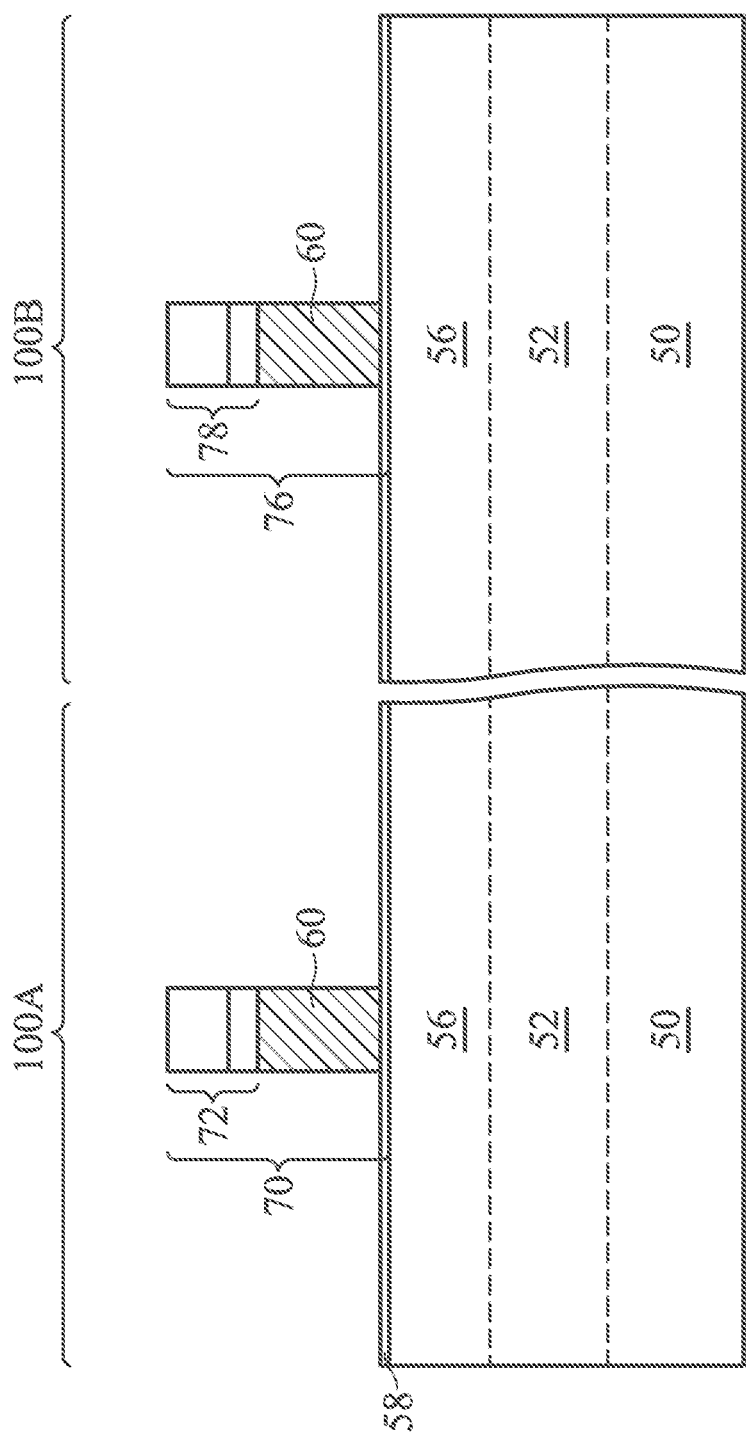
Figure 7C:
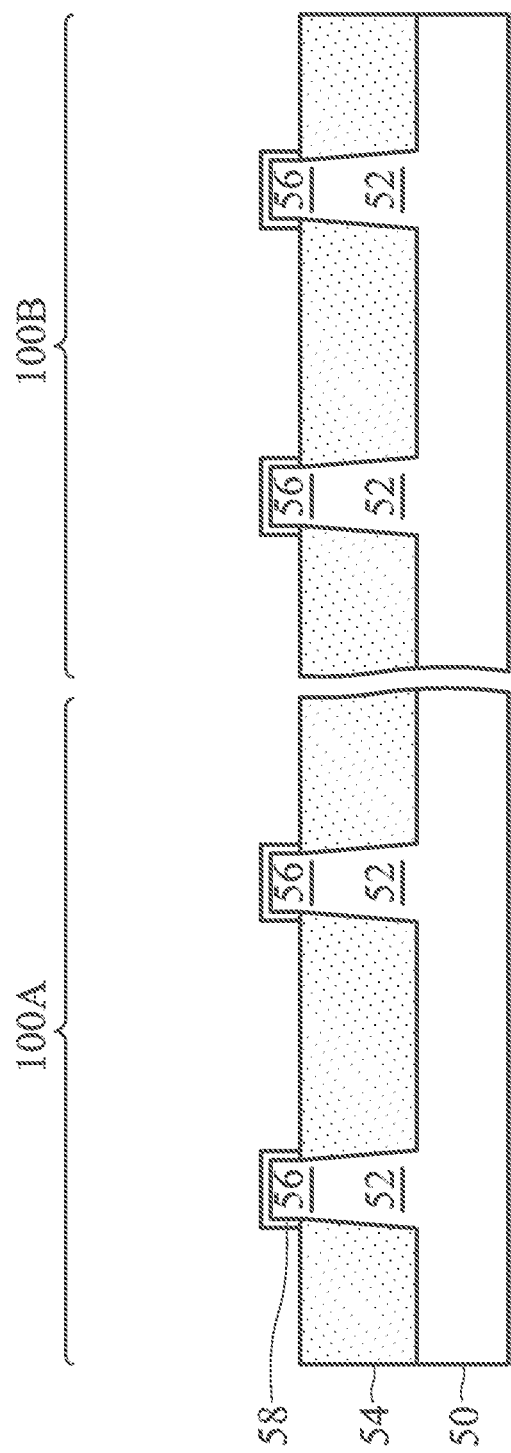

In FIGS. 7A, 7B, and 7C, the mask 62 (see FIGS. 6A and 6B) may be patterned using acceptable photolithography and etching techniques to form a mask 72 in the first region 100A and a mask 78 in the second region 100B. The pattern of the masks 72 and 78 then may be transferred to the dummy gate layer 60 by an acceptable etching technique to form dummy gates 70 in the first region 100A and dummy gates 76 in the second region 100B. Optionally, the pattern of the masks 72 and 78 may similarly be transferred to dummy dielectric layer 58. The pattern of the dummy gates 70 and 76 cover respective channel regions of the fins 56 while exposing source/drain regions of the fins 56. The dummy gates 70 and 76 may also have a lengthwise direction substantially perpendicular to the lengthwise direction of respective fins 56. A size of the dummy gates 70 and 76, and a pitch between dummy gates 70 and 76, may depend on a region of a die in which the dummy gates are formed. In some embodiments, dummy gates 70 and 76 may have a larger size and a larger pitch when located in an input/output region of a die (e.g., where input/output circuitry is disposed) than when located in a logic region of a die (e.g., where logic circuitry is disposed). In some embodiments, the dummy gates 70 may have a width between about 15 nm and about 27 nm, and the dummy gates 76 may have a width between about 15 nm and about 27 nm.

Referring further to FIGS. 7A, 7B and 7C, appropriate wells (not shown) may be formed in the fins 56, the semiconductor strips 52, and/or the substrate 50. For example, a P-well may be formed in the first region 100A, and an N-well may be formed in the second region 100B. The different implant steps for the different regions 100A and 100B may be achieved using a photoresist or other masks (not shown). For example, a photoresist is formed over the fins 56 and the isolation regions 54 in the first region 100A and the second region 100B. The photoresist is patterned to expose the second region 100B of the substrate 50, such as a PMOS region, while protecting the first region 100A, such as an NMOS region. The photoresist can be formed by using a spin-on technique and can be patterned using acceptable photolithography techniques. Once the photoresist is patterned, n-type impurities are implanted in the second region 100B, and the photoresist may act as a mask to substantially prevent n-type impurities from being implanted into the first region 100A. The n-type impurities may be phosphorus, arsenic, or the like, and may be implanted in the second region 100B to a concentration of equal to or less than $10^{18}$ cm$^{-3}$, such as in a range from about $10^{17}$ cm$^{-3}$ to about $10^{18}$ cm$^{-3}$. After the implantation process, the photoresist is removed using, for example, an acceptable ashing process followed by a wet cleaning process.

Following the implanting of the second region 100B, a second photoresist (not shown) is formed over the fins 56 and the isolation regions 54 in the first region 100A and the second region 100B. The second photoresist is patterned to expose the first region 100A of the substrate 50, while protecting the second region 100B. The second photoresist can be formed by using a spin-on technique and can be patterned using acceptable photolithography techniques. Once the second photoresist is patterned, p-type impurities are implanted in the first region 100A, and the second photoresist may act as a mask to substantially prevent p-type impurities from being implanted into the second region 100B. The p-type impurities may be boron, BF$_2$, or the like, and may be implanted in the first region 100A to a concentration of equal to or less than $10^{18}$ cm$^{-3}$, such as in a range from about $10^{17}$ cm$^{-3}$ to about $10^{18}$ cm$^{-3}$. After the implantation process, the second photoresist is removed using, for example, an acceptable ashing process followed by a wet cleaning process.

After implanting appropriate impurities in first region 100A and the second region 100B, an anneal may be performed to activate the p-type and n-type impurities that were implanted. The implantation process may form a P-well in the first region 100A, and an N-well in the second region 100B. In some embodiments where the fins are epitaxial grown, the grown materials of the fins 56 may be in situ doped during the growth process.

Figure 8A:
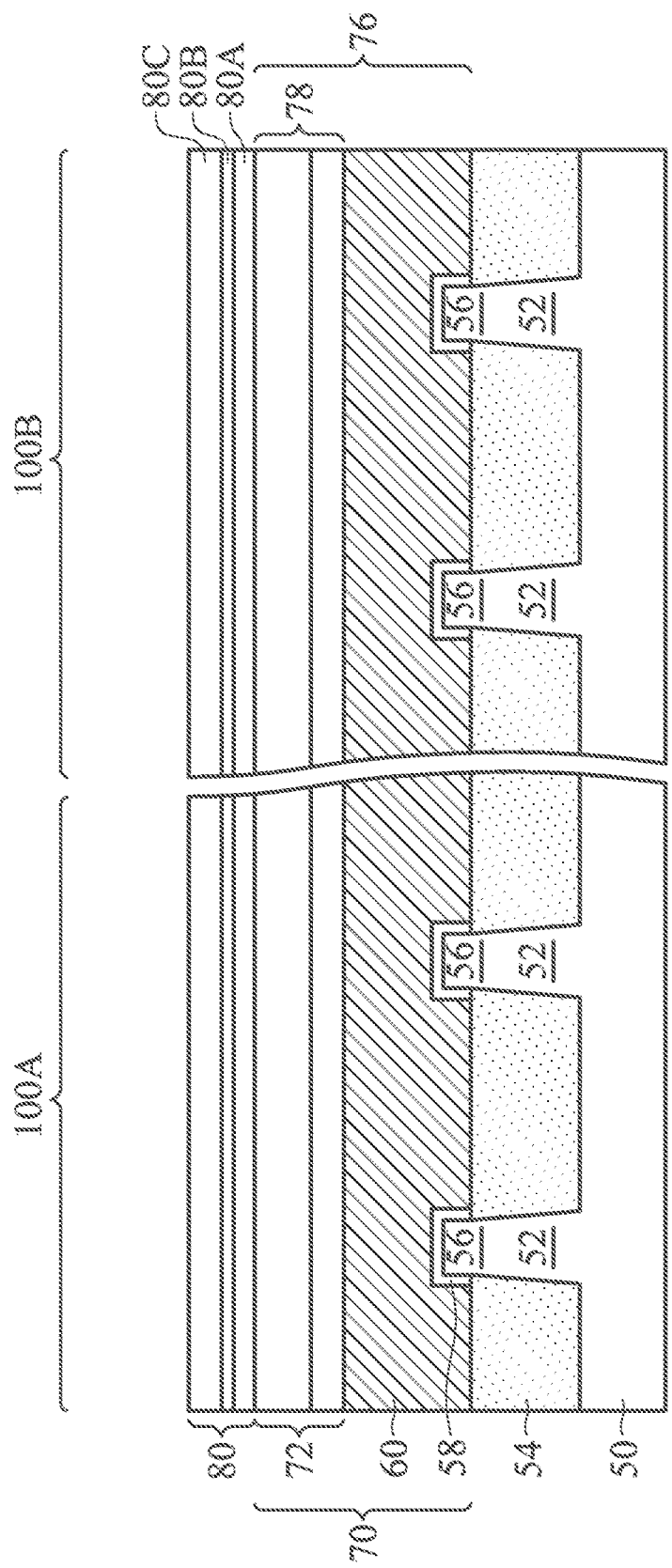
FIGS. 8A, 8B and 8C are cross-sectional views of intermediate stages in the manufacture of a FinFET device in accordance with some embodiments.
Figure 8B:
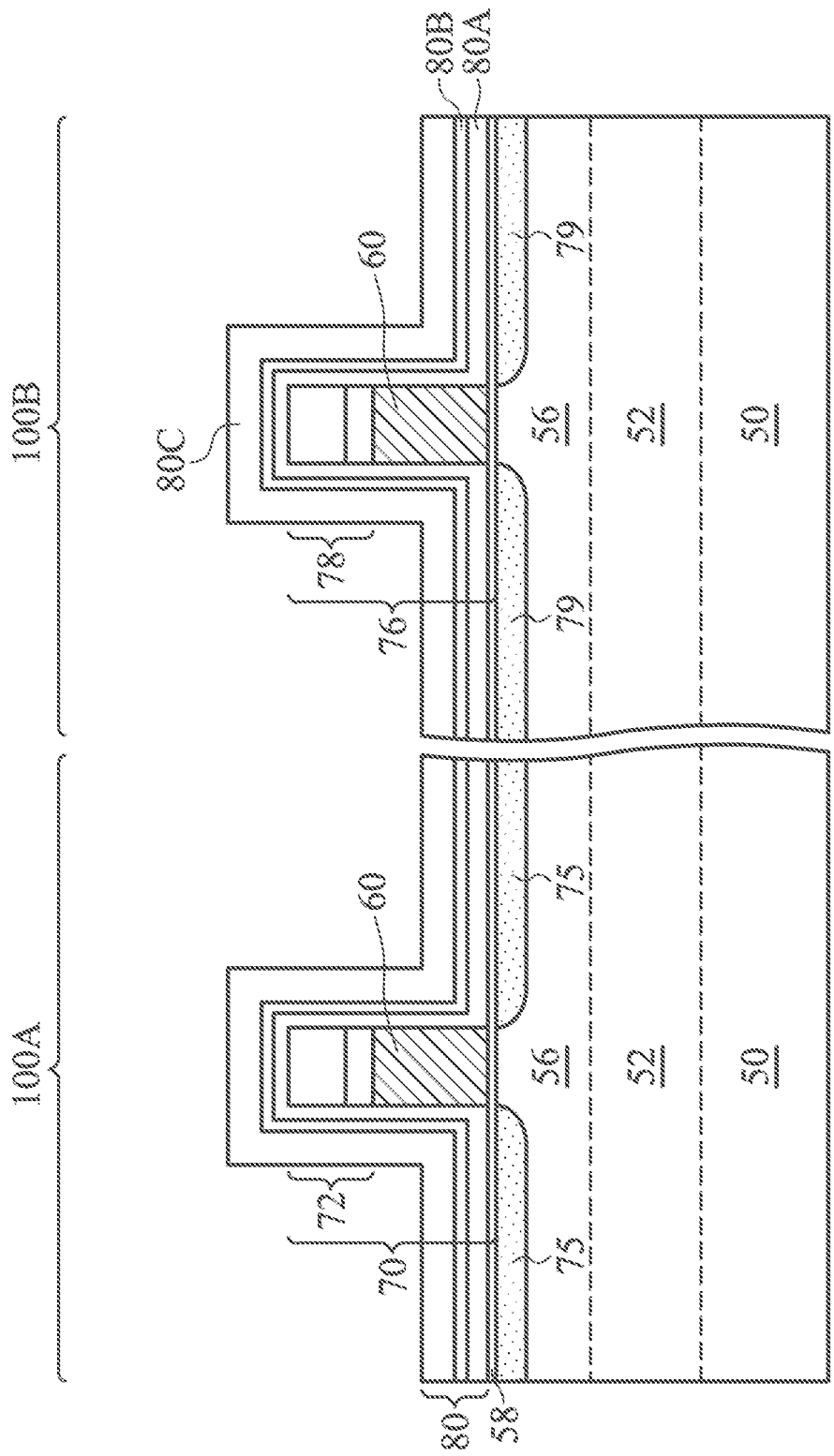
Figure 8C:
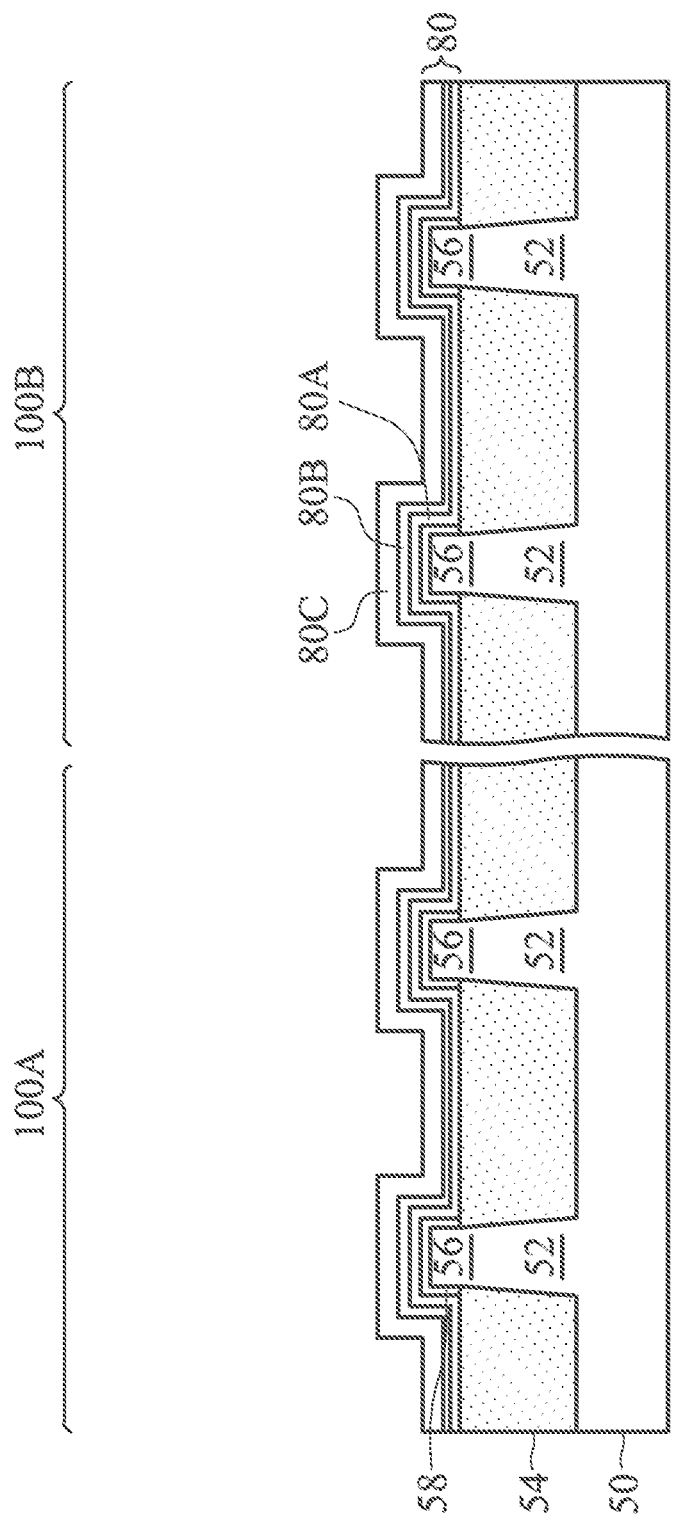

In FIGS. 8A, 8B, and 8C, a gate spacer layer 80 is formed on exposed surfaces of the dummy gates 70 and 76 (see FIGS. 8A and 8B) and/or the dummy dielectric layer 58 over the fins 56 (see FIG. 8C). Any suitable methods of forming the gate spacer layer 80 may be used. In some embodiments, a deposition (such as CVD, ALD, or the like) may be used form the gate spacer layer 80. In some embodiments, the gate spacer layer 80 may include one or more layers of, for example, silicon nitride (SiN), silicon oxynitride, silicon carbonitride, silicon oxycarbonitride (SiOCN), a combination thereof, or the like. In some embodiments, the gate spacer layer 80 may comprise a first gate spacer layer 80A, a second gate spacer layer 80B over the first gate spacer layer 80A, and a third gate spacer layer 80C of the second gate spacer layer 80B. In an embodiment, the first gate spacer layer 80A comprises SiOCN, the second gate spacer layer 80B comprises SiOCN, and the third gate spacer layer 80C comprises SiN. In some embodiment, the first gate spacer layer 80A has a thickness between about 3 nm and about 5 nm, the second gate spacer layer 80B has a thickness between about 3 nm and about 5 nm, and the third gate spacer layer 80C has a thickness between about 4 nm and about 6 nm.

Referring further to FIGS. 8A, 8B, and 8C, after forming the first spacer layer 80A, lightly doped source/drain (LDD) regions 75 and 79 may be formed in the substrate 50 in the first region 100A and the second region 100B, respectively. Similar to the implantation process discussed above with reference to FIGS. 7A, 7B and 7C, a mask (not shown), such as a photoresist, may be formed over the first region 100A, e.g., the NMOS region, while exposing the second region 100B, e.g., the PMOS region, and p-type impurities may be implanted into the exposed fins 56 in the second region 100B to create LDD regions 79. During the implantation of the LDD regions 79, the dummy gate 76 may act as a mask to prevent (or at least reduce) dopants from implanting into a channel region of the exposed fins 56. Thus, the LDD regions 79 may be formed substantially in source/drain regions of the exposed fins 56. The mask may then be removed. Subsequently, a second mask (not shown), such as a photoresist, may be formed over the second region 100B, while exposing the first region 100A, and n-type impurities may be implanted into the exposed fins 56 in the first region 100A to create LDD regions 75. During the implantation of the LDD regions 75, the dummy gate 70 may act as a mask to prevent (or at least reduce) dopants from implanting into a channel region of the exposed fins 56. Thus, the LDD regions 75 may be formed substantially in source/drain regions of the exposed fins 56. The second mask may then be removed. The n-type impurities may be any of the n-type impurities previously discussed, and the p-type impurities may be any of the p-type impurities previously discussed. The LDD regions 75 and 79 may each have a concentration of impurities from about $10^{15}$ cm$^{-3}$ to about $10^{16}$ cm$^{-3}$. An annealing process may be performed to activate the implanted impurities.

Referring further to FIGS. 8A, 8B, and 8C, after forming the LDD regions 75 and 79, the first spacer layer 80A may be carbon doped using a suitable doping process. In the illustrated embodiments, carbon doping of the first spacer layer 80A is performed after the LDD regions 75 and 79 are formed. In other embodiments, carbon doping of the first spacer layer 80A may be performed after forming the first gate spacer layer 80A, but before forming the LDD regions 75 and 79. Subsequently, the second gate spacer layer 80B is formed over the first gate spacer layer 80A, and the third gate spacer layer 80C is formed over the second gate spacer layer 80B. In some embodiments, the second spacer layer 80B may also be carbon doped using a suitable doping process. In other embodiments, the second spacer layer 80B and the third spacer layer 80C may also be carbon doped using suitable doping processes.

Figure 9A:
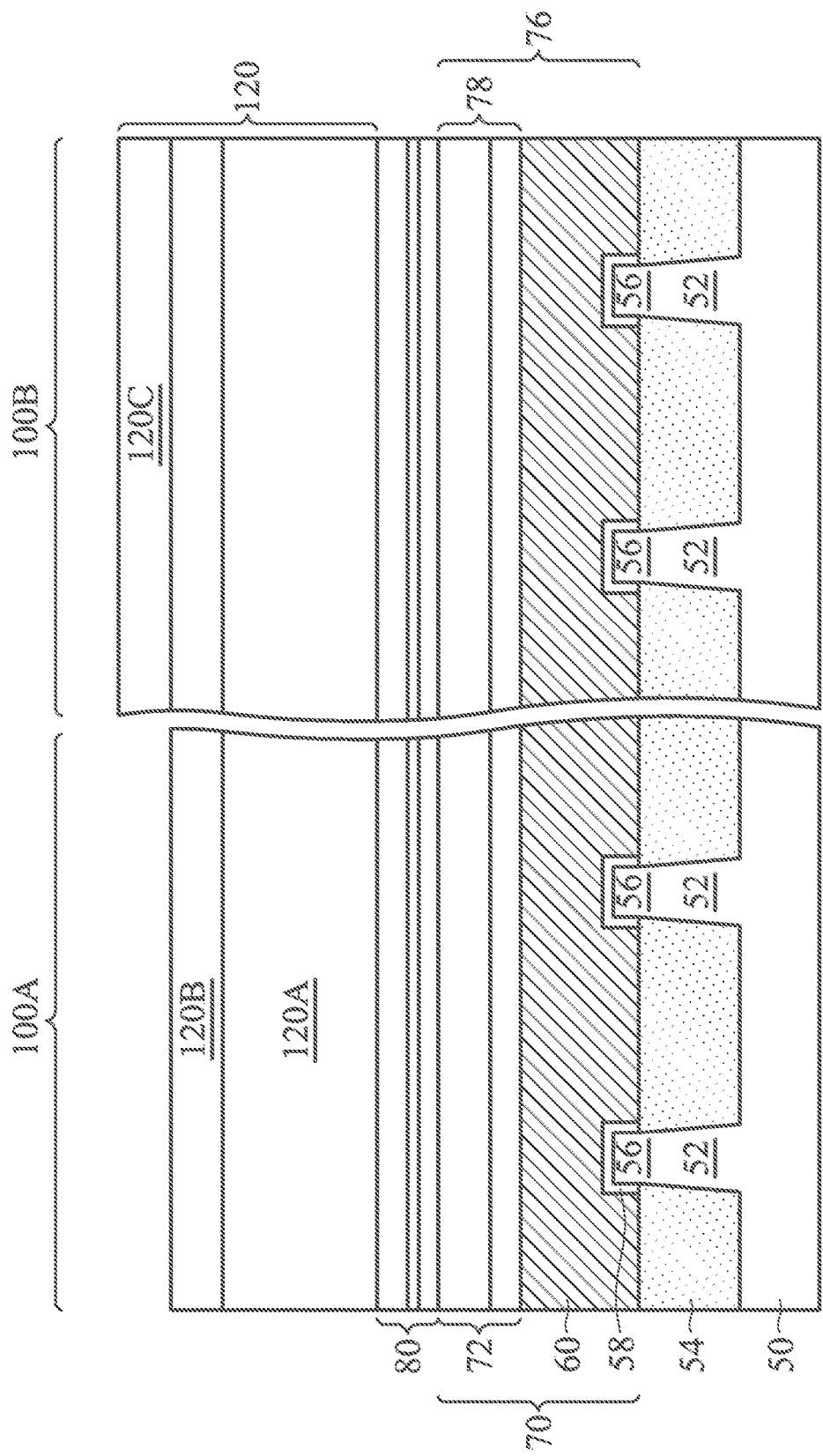
FIGS. 9A, 9B and 9C are cross-sectional views of intermediate stages in the manufacture of a FinFET device in accordance with some embodiments.
Figure 9B:
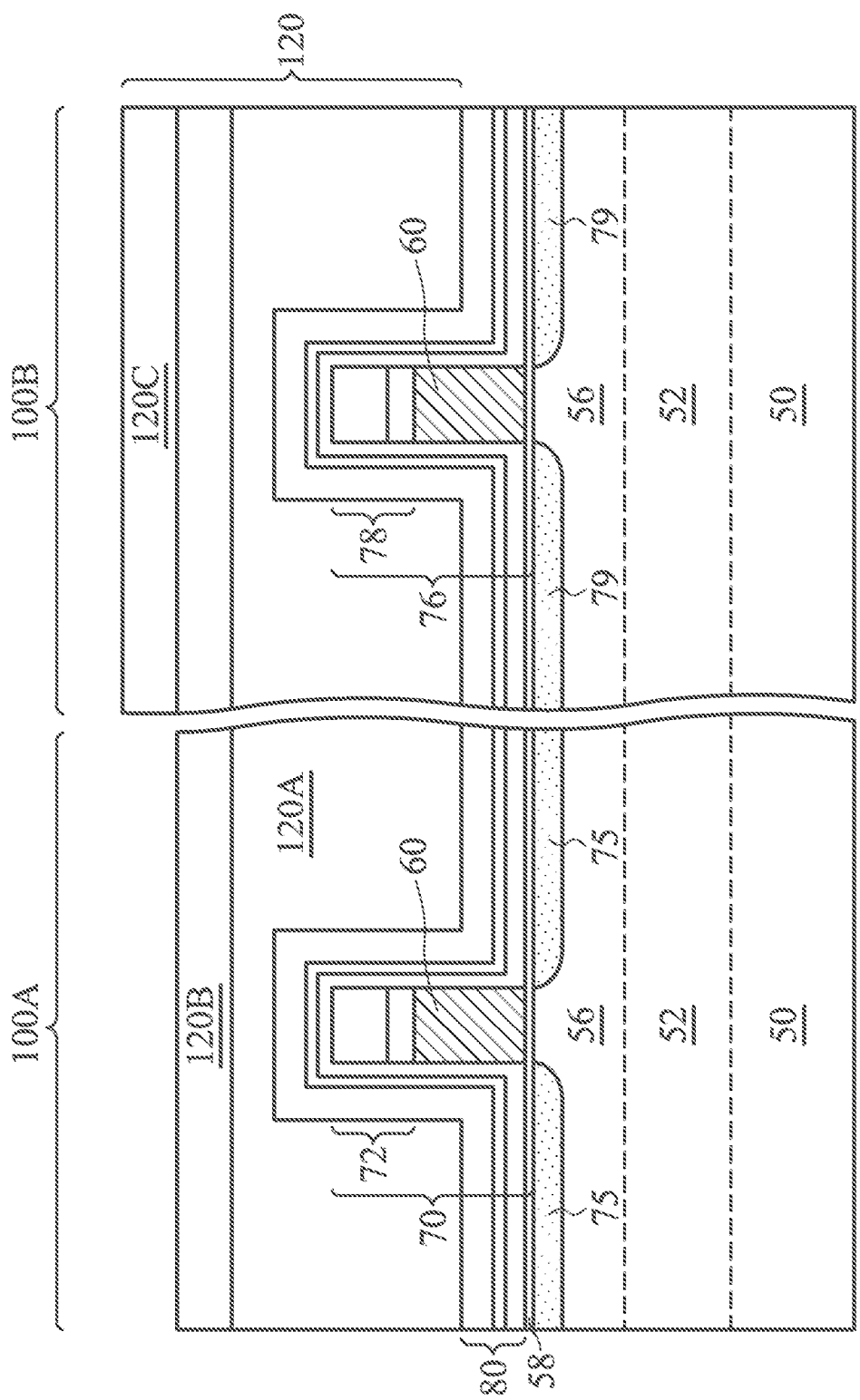
Figure 9C:
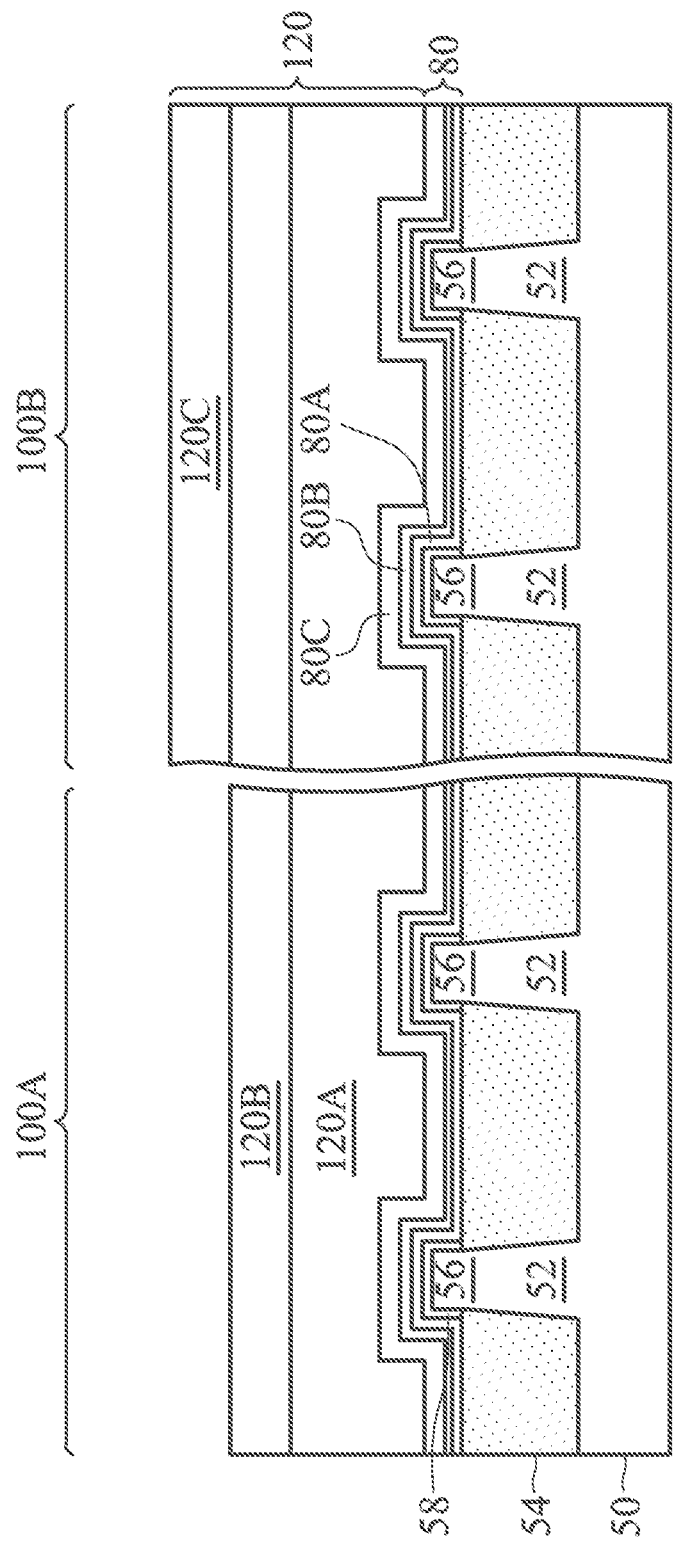

Referring to FIGS. 9A, 9B, 9C, 10A, 10B, and 10C, a patterning process is performed to remove excess portions of the spacer layer 80 in the first region 100A. Any acceptable patterning process may be used. Referring first to FIGS. 9A, 9B, and 9C, in some embodiments, a tri-layer mask 120 is formed over the first region 100A and the second region 100B. The tri-layer mask 120 comprises a bottom layer 120A, a middle layer 120B over the bottom layer 120A, and a top layer 120C over the middle layer 120B. In some embodiments, the bottom layer 120A may comprise an organic material, such as a spin-on carbon (SOC) material, or the like, and may be formed using spin-on coating, CVD, ALD, or the like. The middle layer 120B may comprise an inorganic material, which may be a nitride (such as SiN, TiN, TaN, or the like), an oxynitride (such as SiON), an oxide (such as silicon oxide), or the like, and may be formed using CVD, ALD, or the like. The top layer 120C may comprise an organic material, such as a photoresist material, and may be formed using a spin-on coating, or the like. In some embodiments, the top layer 120C of the tri-layer mask 120 is patterned to expose the first region 100A. The top layer 120C may be patterned using suitable photolithography techniques.

Figure 10A:
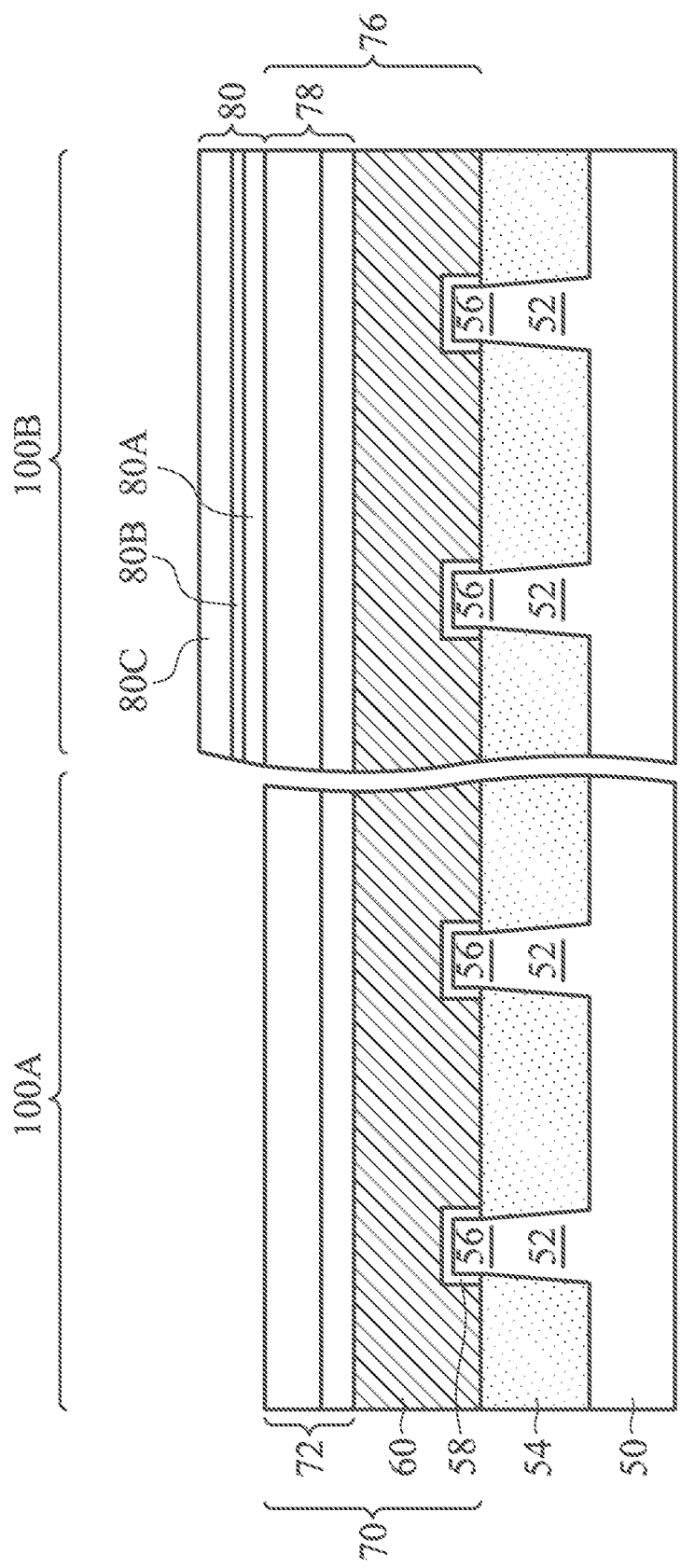
FIGS. 10A, 10B, and 10C are cross-sectional views of intermediate stages in the manufacture of a FinFET device in accordance with some embodiments.
Figure 10B:
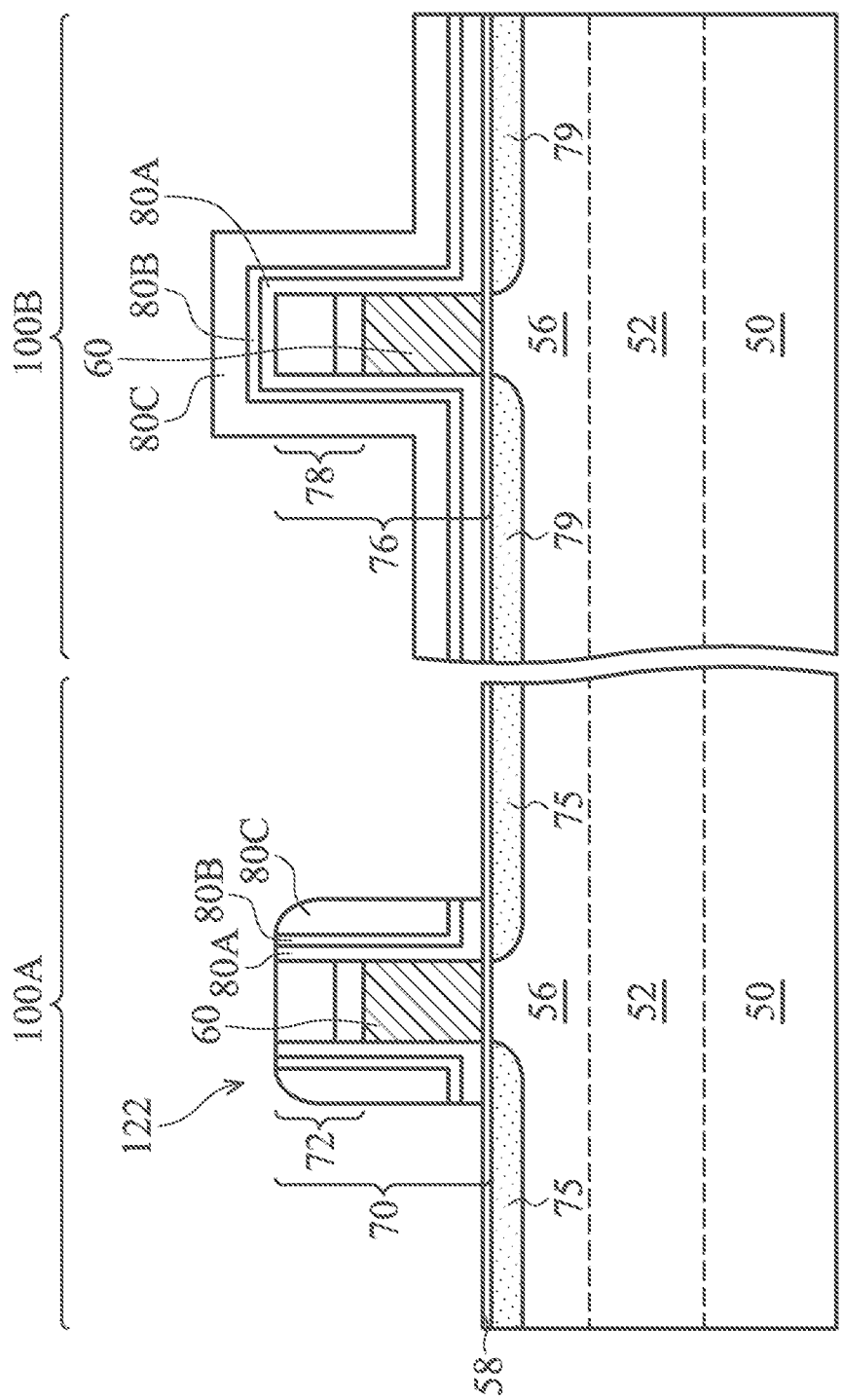
Figure 10C:
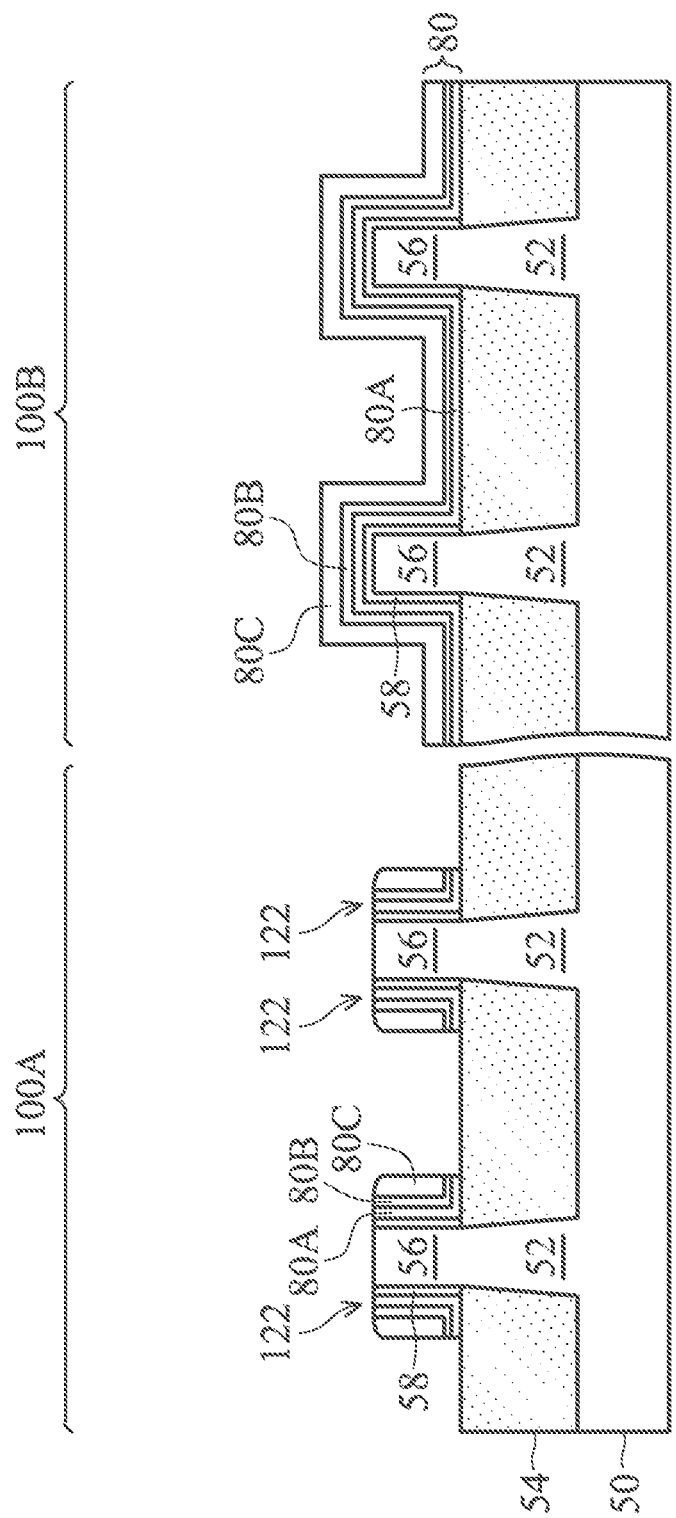

Referring to FIGS. 10A, 10B, and 10C, an etching process is performed using the patterned tri-layer mask 120 as a mask. The etching process may be anisotropic. After preforming the etching process, lateral portions of the first spacer layer 80A, the second spacer layer 80B, and the third spacer layer 80C over the LDD regions 75 and over the isolation regions 54 may be removed to expose top surfaces of the fins 56 and the masks 72 for the dummy gate stacks 70. Portions of the first spacer layer 80A, the second spacer layer 80B, and the third spacer layer 80C along sidewalls of the dummy gates 70 and the fins 56 may remain and form spacers 122. In other embodiments, the spacer layer 80 may also be removed from the sidewalls of the fins 56. After patterning the spacer layer 80, the tri-layer mask 120 may be removed using any suitable removal process.

FIGS. 11A through 15C illustrate the formation of epitaxial source/drain regions 82 and 84 in the first region 100A and the second region 100B. In some embodiments, the epitaxial source/drain regions 82 (see FIGS. 15B and 15C) in the first region 100A may be formed before the epitaxial source/drain regions 84 (see FIGS. 15B and 15C) are formed in the second region 100B. In other embodiments, the epitaxial source/drain regions 84 in the second region 100B may be formed before forming the epitaxial source/drain regions 82 in first region 100A.

Figure 11A:
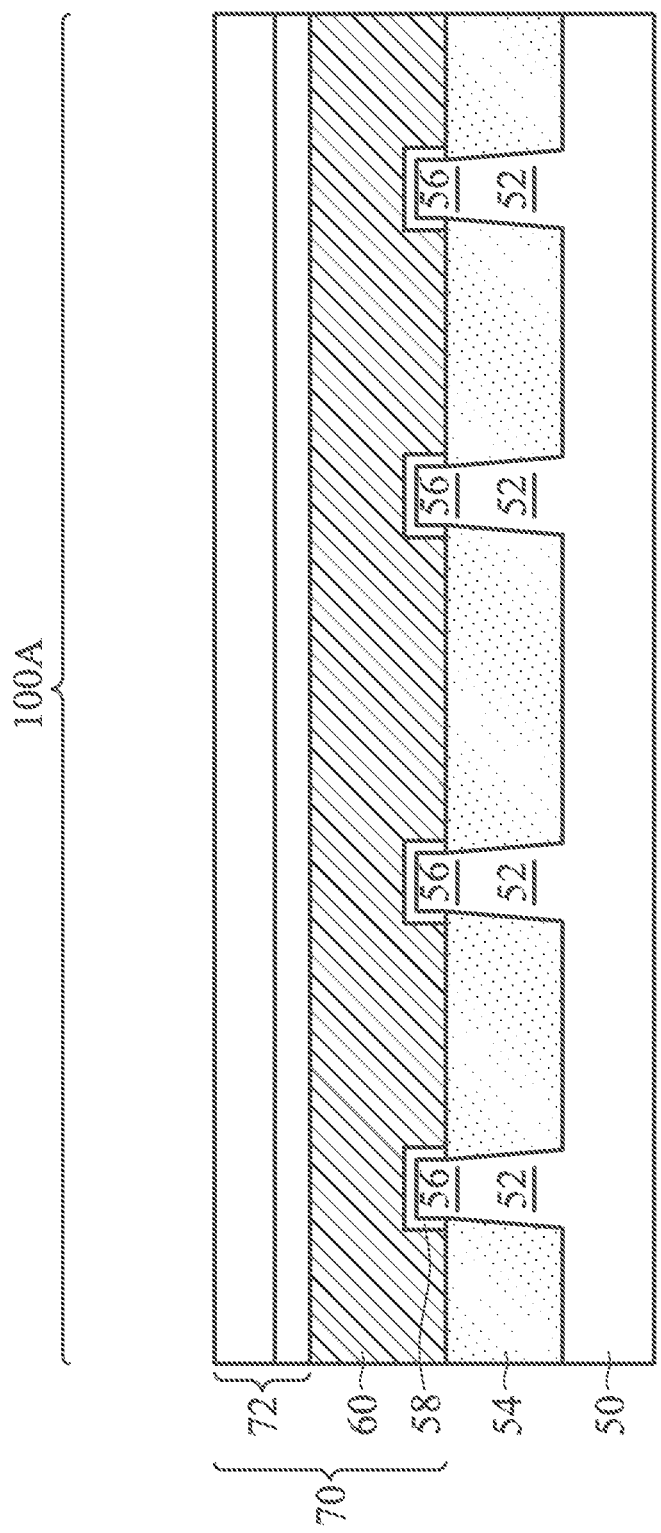
FIGS. 11A, 11B, and 11C are cross-sectional views of intermediate stages in the manufacture of a FinFET device in accordance with some embodiments.
Figure 11B:
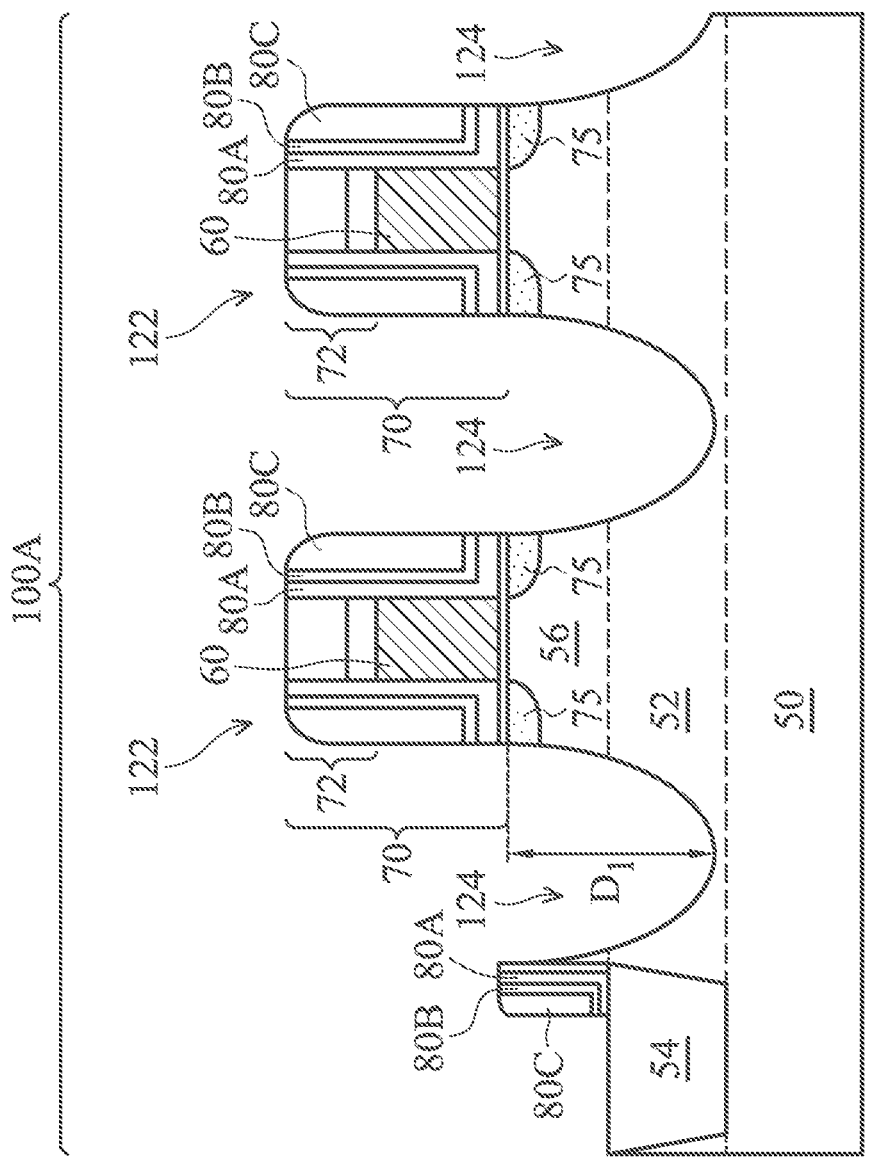
Figure 11C:
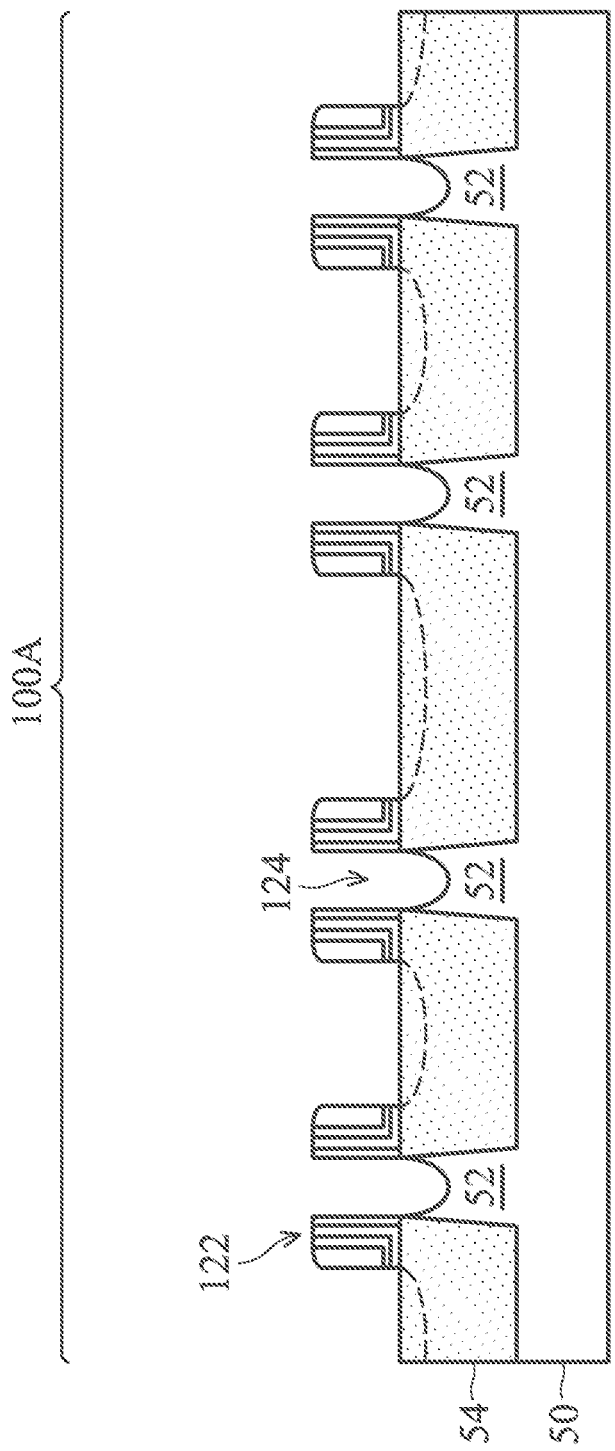

FIGS. 11A through 14C illustrate the formation of the epitaxial source/drain regions 82 in the first region 100A. During the formation of the epitaxial source/drain regions 82 in first region 100A, e.g., the NMOS region, the second region 100B, e.g., the PMOS region may be masked (not shown). Referring first to FIGS. 11A, 11B, and 11C, a first patterning process is performed on the fins 56 to form recesses 124 in source/drain regions of the fins 56. The first patterning process may be performed in a manner that the recesses 124 are formed between neighboring dummy gates 70 (in interior regions of the fins 56), or between an isolation region 54 and adjacent dummy gate 70 (in send regions of the fins 56) as shown in the cross section illustrated in FIG. 11B. In some embodiments, the first patterning process may include a suitable anisotropic dry etching process, while using the dummy gates 70, the spacers 122 and/or isolation regions 54 as a combined mask. The suitable anisotropic dry etching process may include a reactive ion etch (RIE), neutral beam etch (NBE), the like, or a combination thereof. In some embodiments where the RIE is used in the first patterning process, process parameters such as, for example, a process gas mixture, a voltage bias, and an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and, thus, increase a rate of physical etching. Since, the physical etching in anisotropic in nature and the chemical etching is isotropic in nature, such an etching process has an etch rate in the vertical direction that is greater than an etch rate in the lateral direction. In some embodiments, the anisotropic etching process may be performed using a process gas mixture including $CH_3F$, $CH_4$, HBr, $O_2$, Ar, a combination thereof, or the like. In some embodiments, the first patterning process forms recesses 124 having U-shaped bottom surfaces. The recesses 124 may also be referred to as U-shaped recesses 124. In some embodiments, the V-shaped recesses 126 have a depth $D_1$, as measured from a top surface of the fins 56, between about 53 nm and about 59 nm. In some embodiments, the etching process for forming the U-shaped recesses 124 may also etch isolation regions, which is illustrated in FIG. 11C by dashed lines.

Figure 12A:
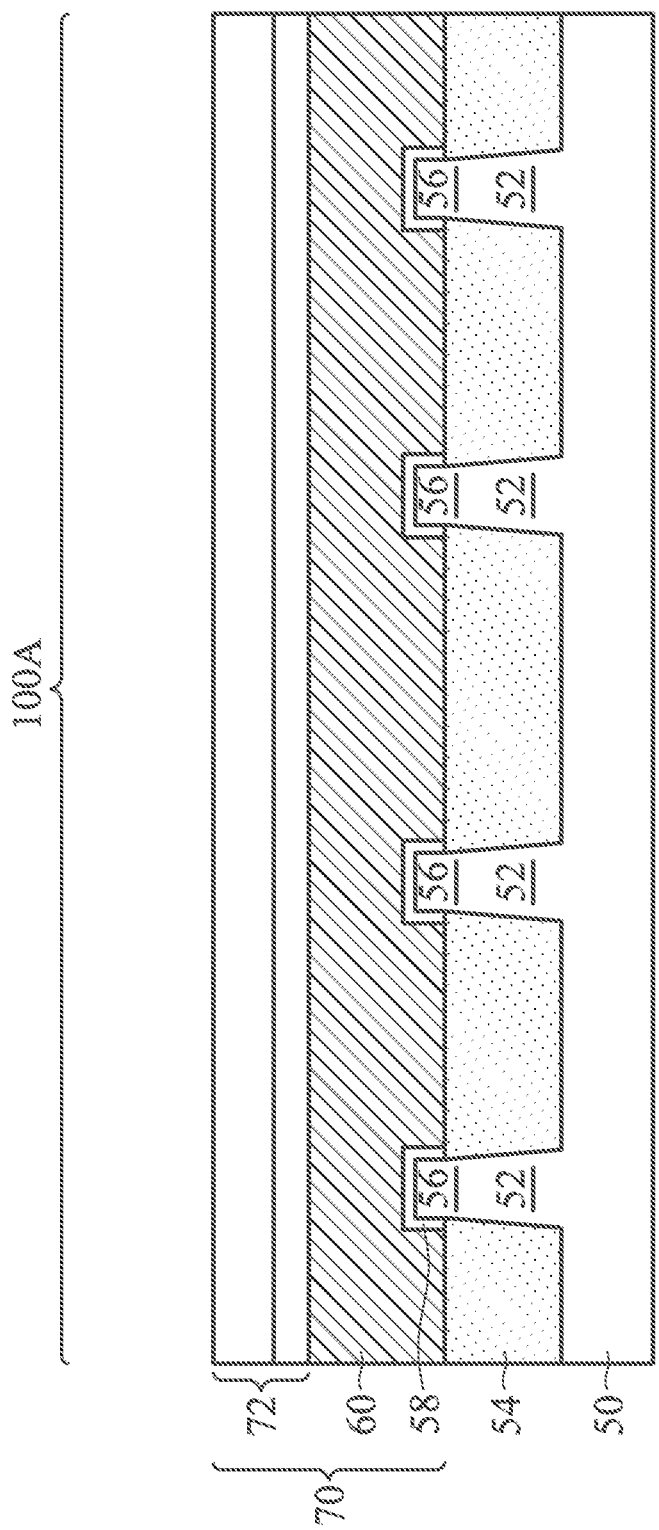
FIGS. 12A, 12B, 12C, and 12D are cross-sectional views of intermediate stages in the manufacture of a FinFET device in accordance with some embodiments.
Figure 12B:
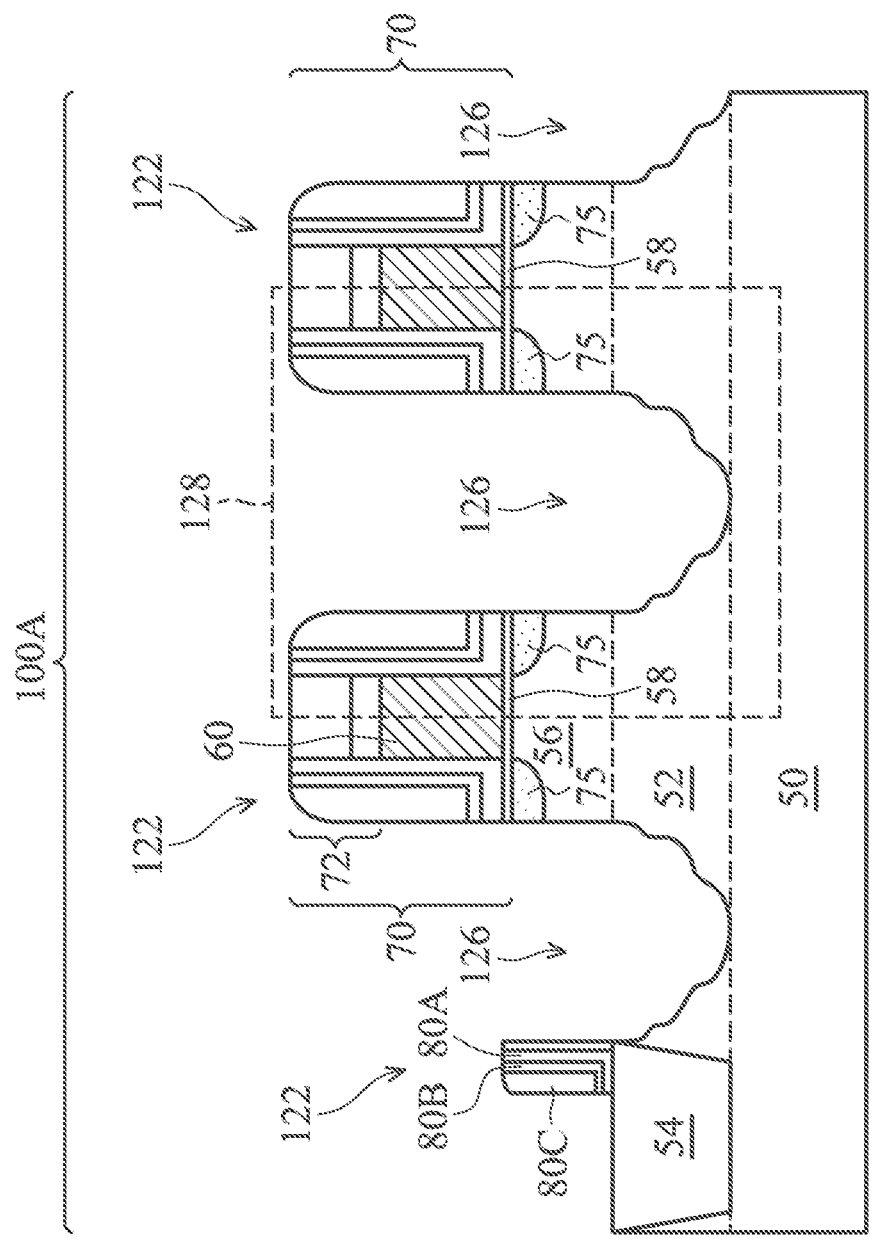
Figure 12C:
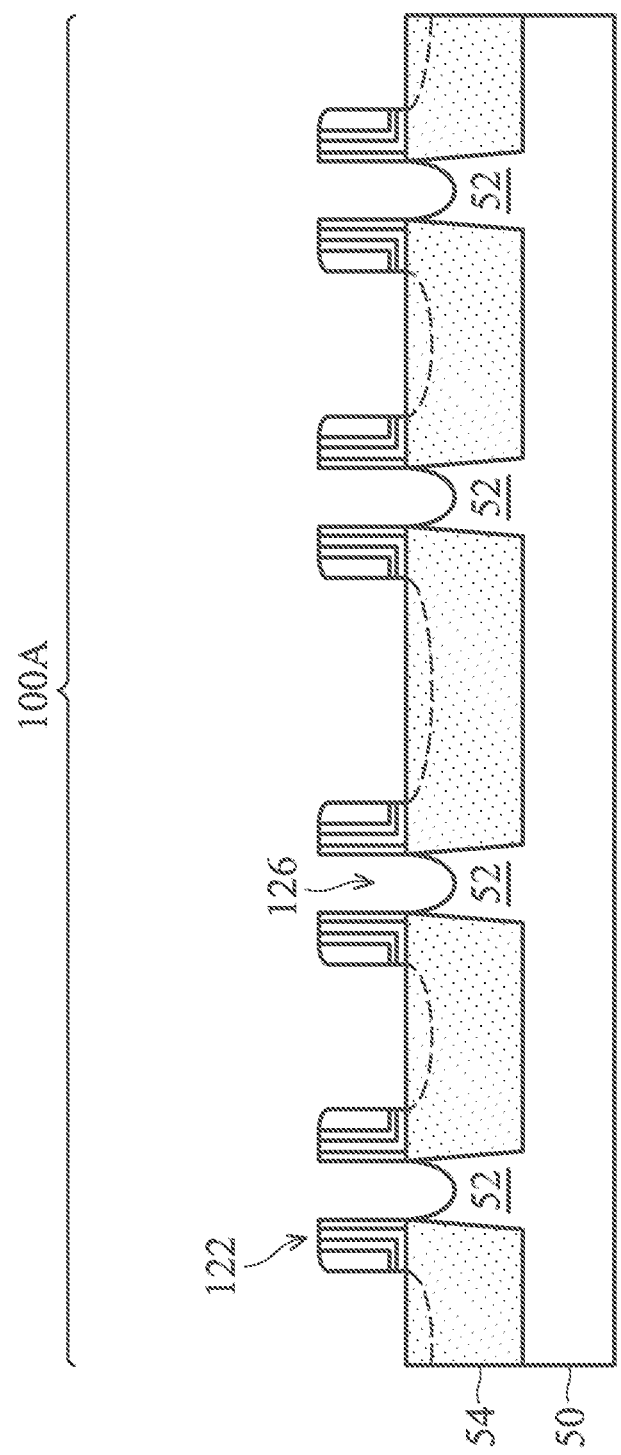

Referring to FIGS. 12A, 12B, and 12C, a second patterning process is performed on the fins 56 to reshape the U-shaped recesses 124 and form recesses 126 having V-shaped bottom surfaces. The recesses 126 may also be referred to as V-shaped recesses 126. In some embodiments, the second patterning process may include a suitable isotropic dry etching process, while using the dummy gates 70, the spacers 122 and/or isolation regions 54 as a combined mask. The suitable isotropic dry etching process may include a dry etch process such that etching is predominantly performed using chemical etching, such as radical etching through chemical reactions, rather than physical etching, such as ion bombardment. In some embodiments, process parameters such as, for example, a process gas mixture may be chosen such that etching is predominantly performed using chemical etching rather than physical etching. In some embodiments, a voltage bias may be reduced to reduce energy of ions used in the ion bombardment process and, thus, reduce a rate of physical etching. Since, the physical etching in anisotropic in nature and the chemical etching is isotropic in nature, such an etching process has an etch rate in the vertical direction that is substantially same as an etch rate in the lateral direction. In some embodiments, radicals that are used for the isotropic etching process may be electrically neutral. In some embodiments, the isotropic etching process may be performed using a process gas mixture including HBr, $CH_3F$, $Cl_2$, $NF_3$, $H_2$, a combination thereof, or the like. In addition to reshaping the U-shaped recesses 124 into the V-shaped recesses 126, the isotropic etching process of the second patterning process may remove portions of the semiconductor strips 52 along sidewalls and a bottom of the U-shaped recesses 124 that are damaged by anisotropic etching process (ion bombardment) of the first patterning process. Furthermore, bottoms of the V-shaped recesses 126 may have stair-like patterns. In some embodiments, the etching process for forming the V-shaped recesses 126 may also etch isolation regions 54, which is illustrated in FIG. 12C by dashed lines.

Figure 12D:
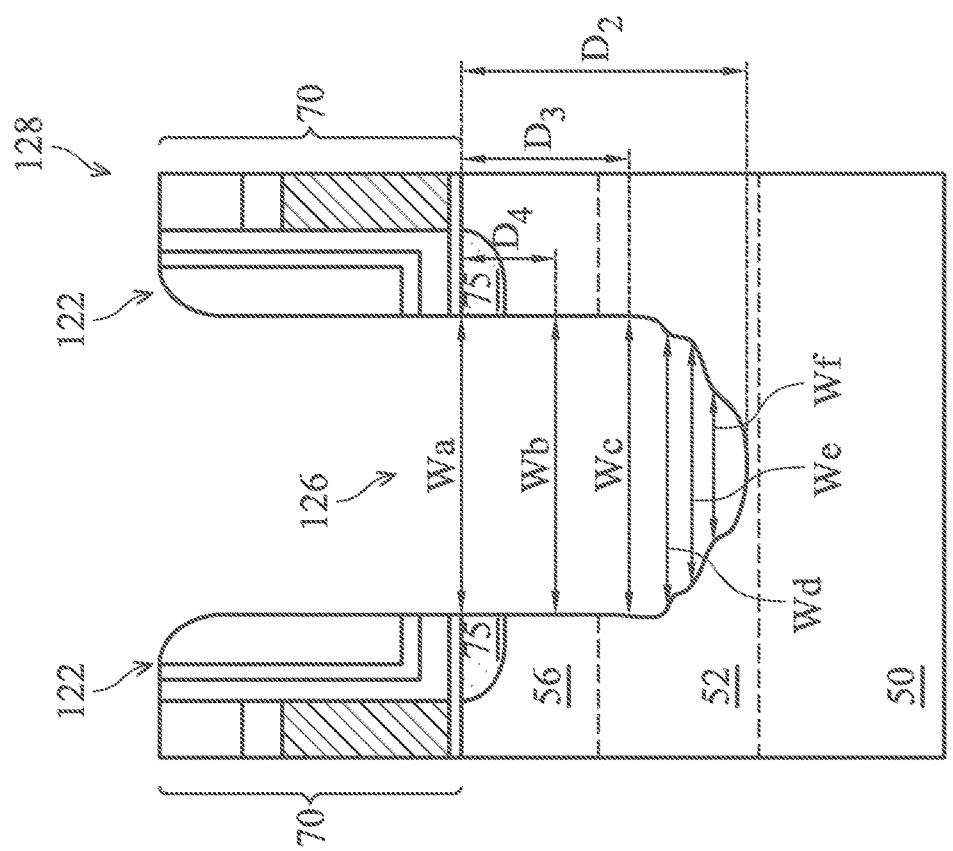

FIG. 12D illustrates a magnified view of a portion 128 (including the V-shaped recess 126) of the structure illustrated in FIG. 12B. In the illustrated embodiment, the V-shaped recesses 126 have bottoms with stair-like patterns that have three steps. In other embodiments, the stair-like patterns may have less or more than three steps. In some embodiments, the number of steps in the stair-like patterns depends on the process parameters of the second patterning process, such as, for example, ratios of amounts of various etchant gases in a process gas mixture and duration of the second patterning process. In some embodiments, etch parameters of the second pattering process may be tuned to change the number of steps in the stair-like patterns. The V-shaped recesses 126 have a depth $D_2$ as measured from the top surface of the fins 56 such that the depth $D_2$ is greater than the depth $D_1$ of the U-shaped recesses 124 (see FIG. 11B). In some embodiments, the depth $D_2$ may be between about 53 nm and about 59 nm. The V-shaped recesses 126 have a width Wa at a zero depth from the top surface of the fins 56, a width Wb at a depth $D_4$ from the top surface of the fins 56, and a width Wc at a depth $D_3$ from the top surface of the fins 56. In the illustrated embodiment, the depth $D_4$ is about 0.5 times the depth $D_2$, and the depth $D_3$ is about 0.9 times the depth $D_2$. In some embodiments, a ratio of the widths Wa:Wb:Wc is about 1:about 0.98 to about 1.01:about 0.97 to about 0.99. Accordingly, the V-shaped recesses 126 may have substantially vertical sidewalls up to the depth $D_3$. In some embodiments, the V-shaped recesses 126 may have an aspect ratio greater than about 5. In the illustrated embodiment, the bottoms of the V-shaped recesses 126 between the depth $D_3$ and the depth $D_2$ have stair-shape pattern with three steps. In the illustrated embodiment, the V-shaped recesses 126 have a width Wd at the first step of the stair-shaped pattern, a width We at a second step of the stair-shaped pattern, and a width Wf at a third step of the stair-shaped pattern, with the first step being nearest to the top surface of the fins 56, the third step being farthest from the top surface of the fins 56, and the second step being interposed between the first step and the second step. In some embodiments, a ratio of the widths Wd:We:Wf is about 1.5 to about 1.8:about 1.3 to about 1.5:about 1.

Referring further to FIGS. 12A, 12B, 12C, and 12D, by removing damaged portions of the semiconductor strips 52 along sidewalls and the bottoms of the U-shaped recesses 124, and by reshaping the U-shaped recesses 124 into the V-shaped recesses 126, the number of misfit dislocations in subsequently formed source/drain regions is reduced or eliminated. Accordingly, relaxation of the source/drain regions through the formation of misfit dislocations may be avoided. Non-relaxed source/drain regions allow for a greater stress to be applied to the channel regions of the resulting FinFETs, which improves performance characteristics of the resulting FinFET device. Furthermore, by reducing the number of misfit dislocations in the source/drain regions, the number of known bad devices in a wafer may be reduced to be less than about 30%, which improves the yield of the known good devices.

Figure 13A:
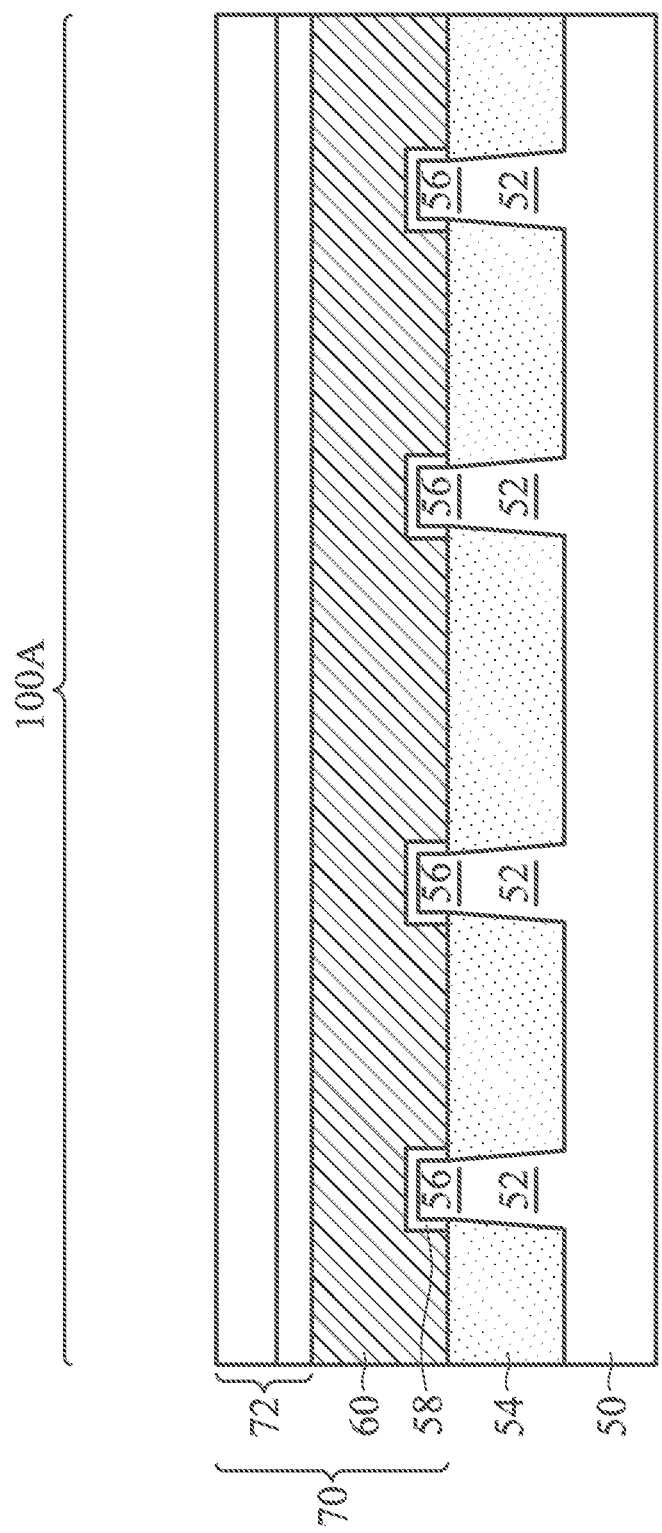
FIGS. 13A, 13B, and 13C are cross-sectional views of intermediate stages in the manufacture of a FinFET device in accordance with some embodiments.
Figure 13B:
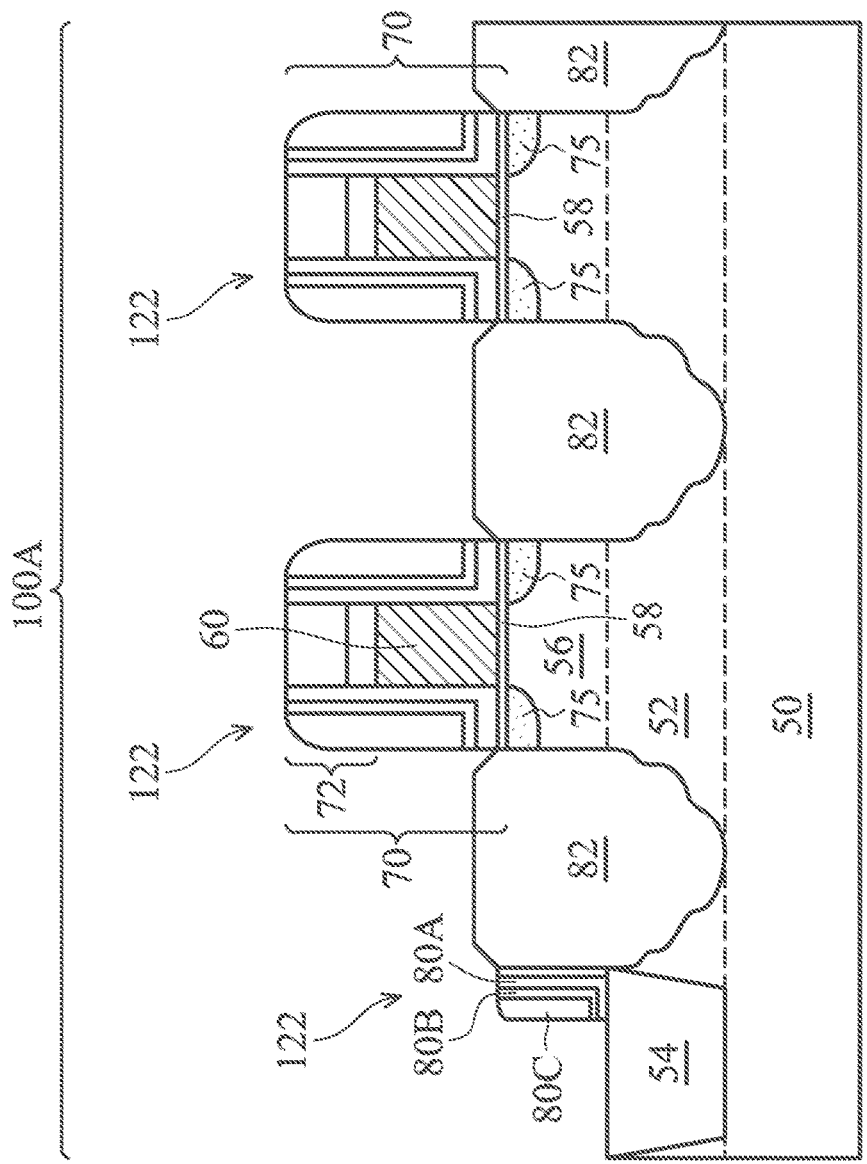
Figure 13C:
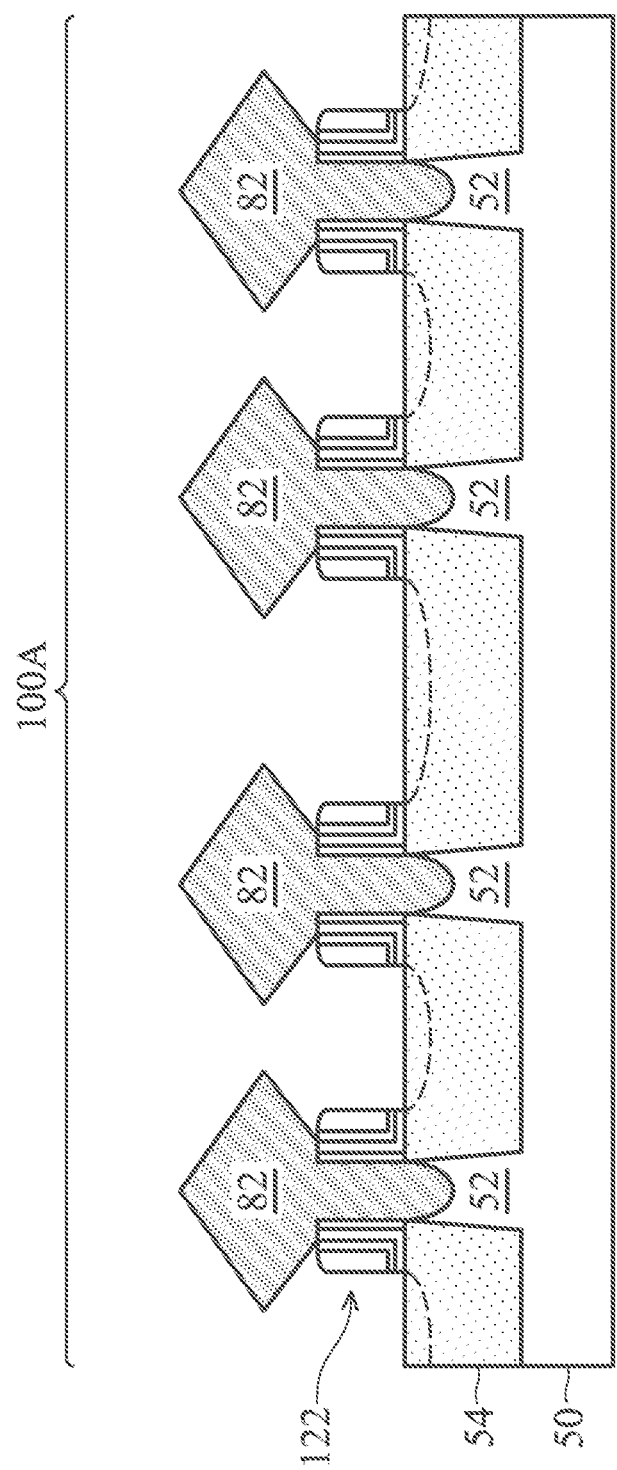

FIGS. 13A, 13B, and 13C illustrate the formation of epitaxial source/drain regions 82 in the first region 100A. In some embodiments, the epitaxial source/drain regions 82 are epitaxially grown in the V-shaped recesses 126 (See FIGS. 12B, 12C, and 12D) using metal-organic CVD (MOCVD), molecular beam epitaxy (MBE), liquid phase epitaxy (LPE), vapor phase epitaxy (VPE), selective epitaxial growth (SEG), a combination thereof, or the like. The epitaxial source/drain regions 82 may include any acceptable material, such as any material that is appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. The epitaxial source/drain regions 82 are formed in the fins 56 such that each dummy gate 70 is disposed between respective neighboring pairs of the epitaxial source/drain regions 82. In some embodiments the epitaxial source/drain regions 82 may extend past the fins 56 and into the semiconductor strips 52.

Figure 19A:
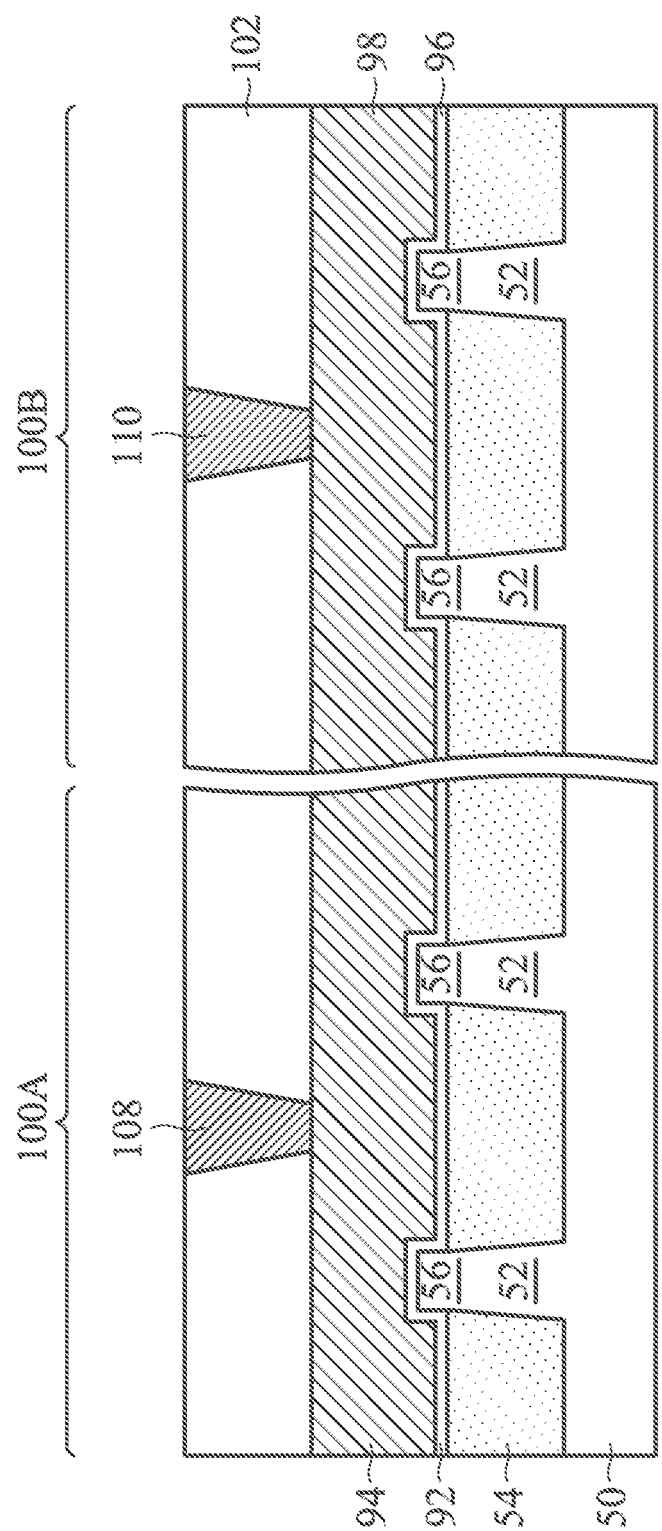
FIGS. 19A, 19B, and 19C are cross-sectional views of a FinFET device in accordance with some embodiments.
Figure 19B:
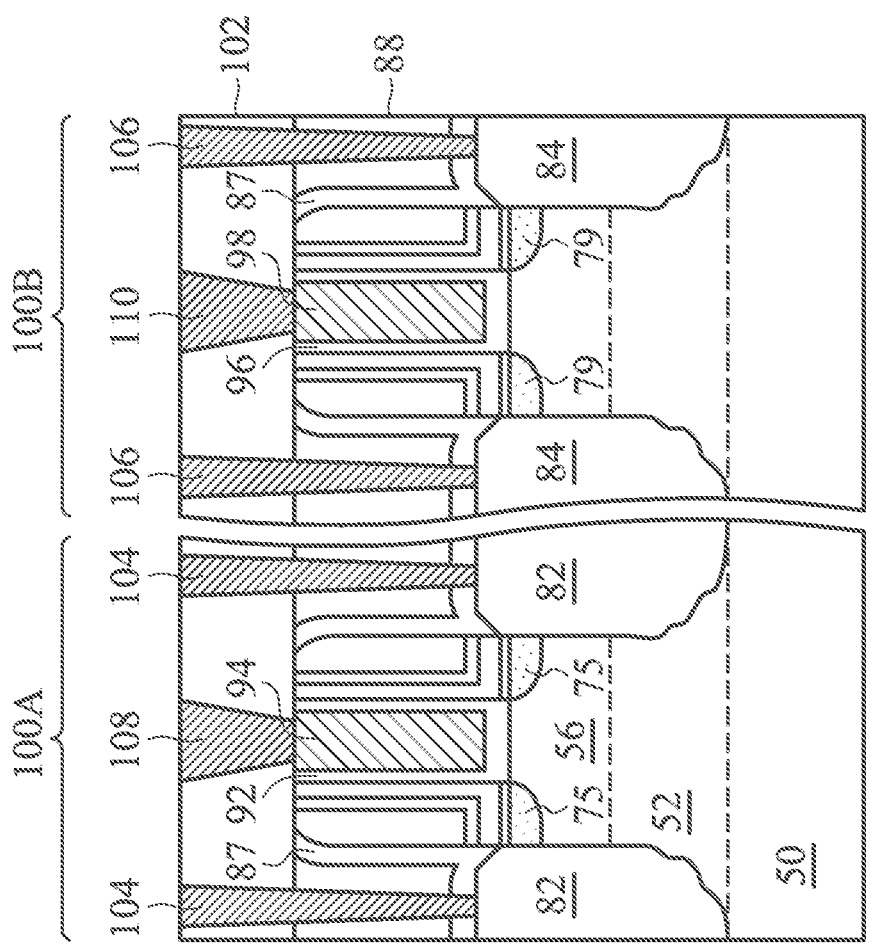
Figure 19C:
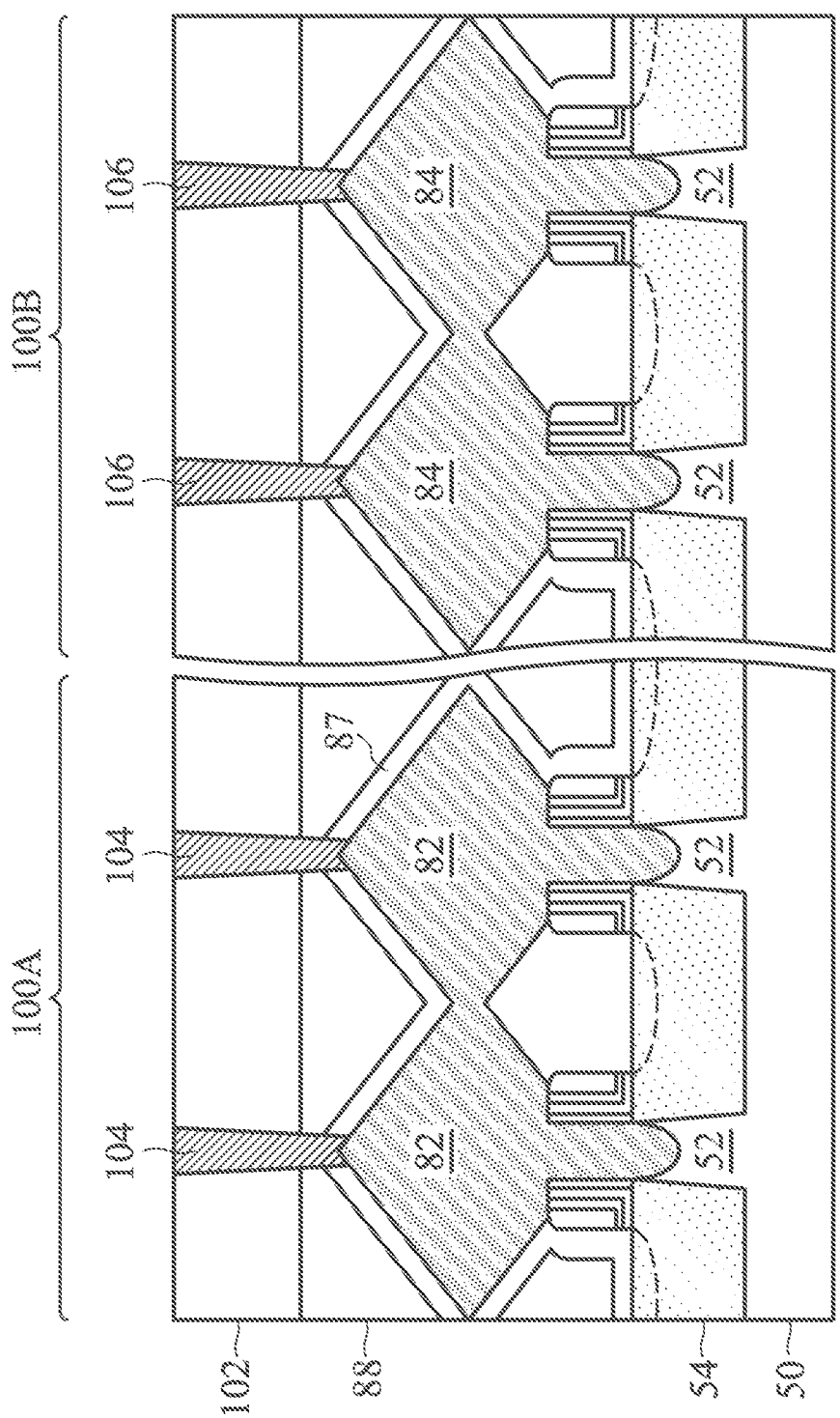

The material of the epitaxial source/drain regions 82 in the first region 100A may be implanted with dopants, similar to the process previously discussed for forming the LDD regions 75, followed by an anneal (see FIGS. 8A, 8B, and 8C). The epitaxial source/drain regions 82 may have an impurity concentration of in a range from about $10^{19}$ cm$^{-3}$ to about $10^{21}$ cm$^{-3}$. The n-type impurities for source/drain regions in the first region 100A, e.g., the NMOS region, may be any of the n-type impurities previously discussed. In other embodiments, the material of the epitaxial source/drain regions 82 may be in situ doped during growth. In the illustrated embodiments, each of the source/drain regions 82 is physically separate from other source/drain regions 82. In other embodiments, two or more adjacent source/drain regions 82 may be merged. Such an embodiment is depicted in FIGS. 19A, 19B, and 19C, such that two adjacent source/drain regions 82 are merged to form a common source/drain region. In some embodiments, more than two adjacent source/drain regions 82 may be merged.

Figure 14A:
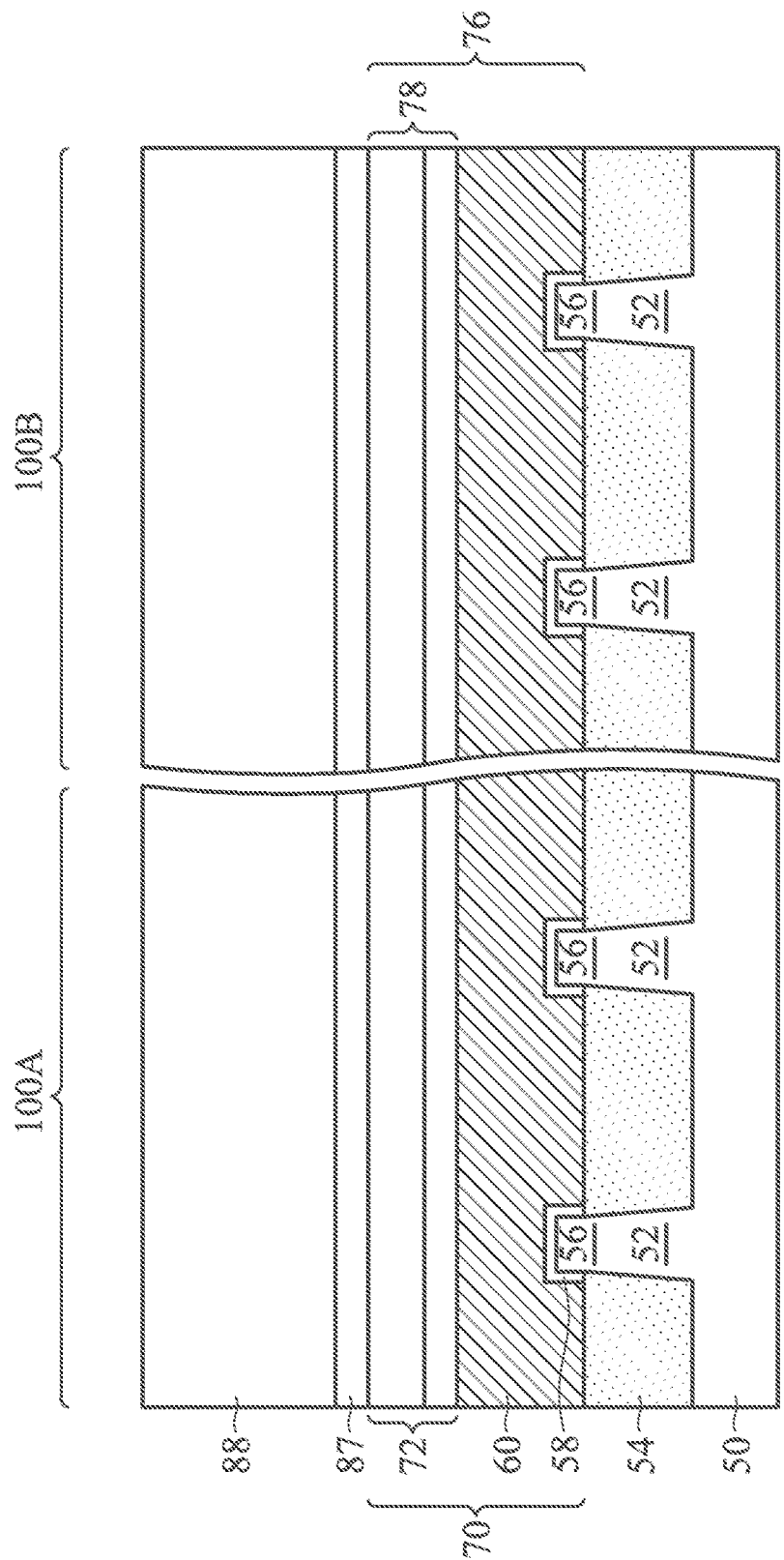
FIGS. 14A, 14B, and 14C are cross-sectional views of intermediate stages in the manufacture of a FinFET device in accordance with some embodiments.
Figure 14B:
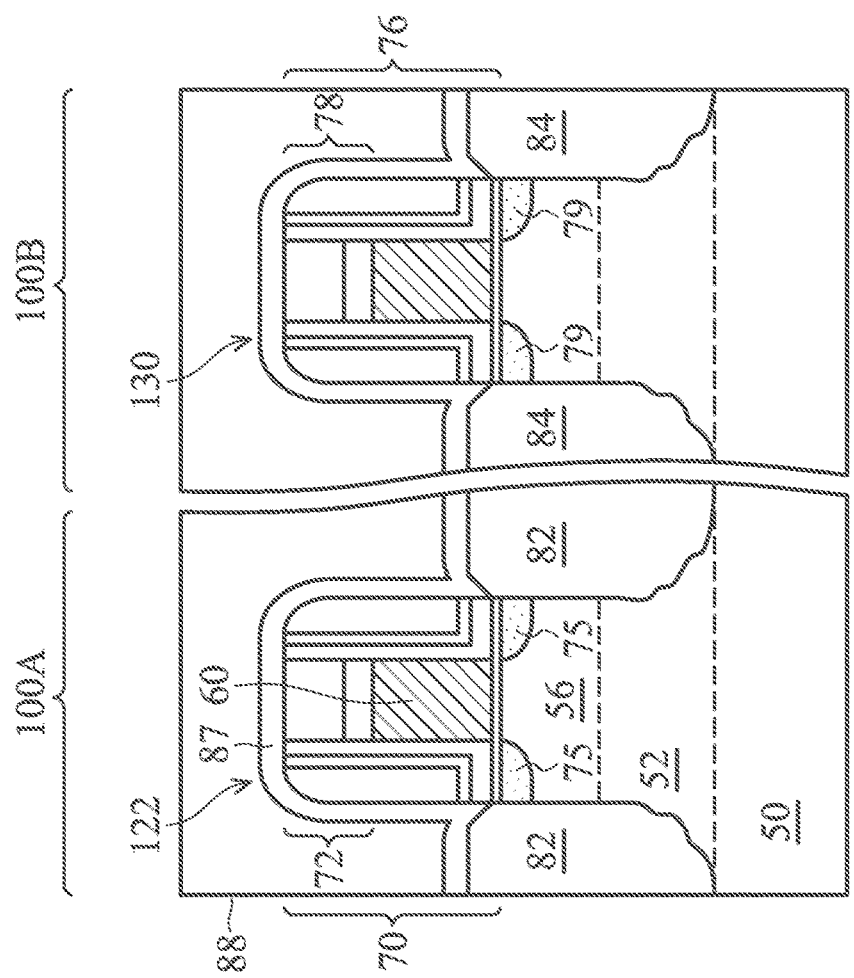
Figure 14C:
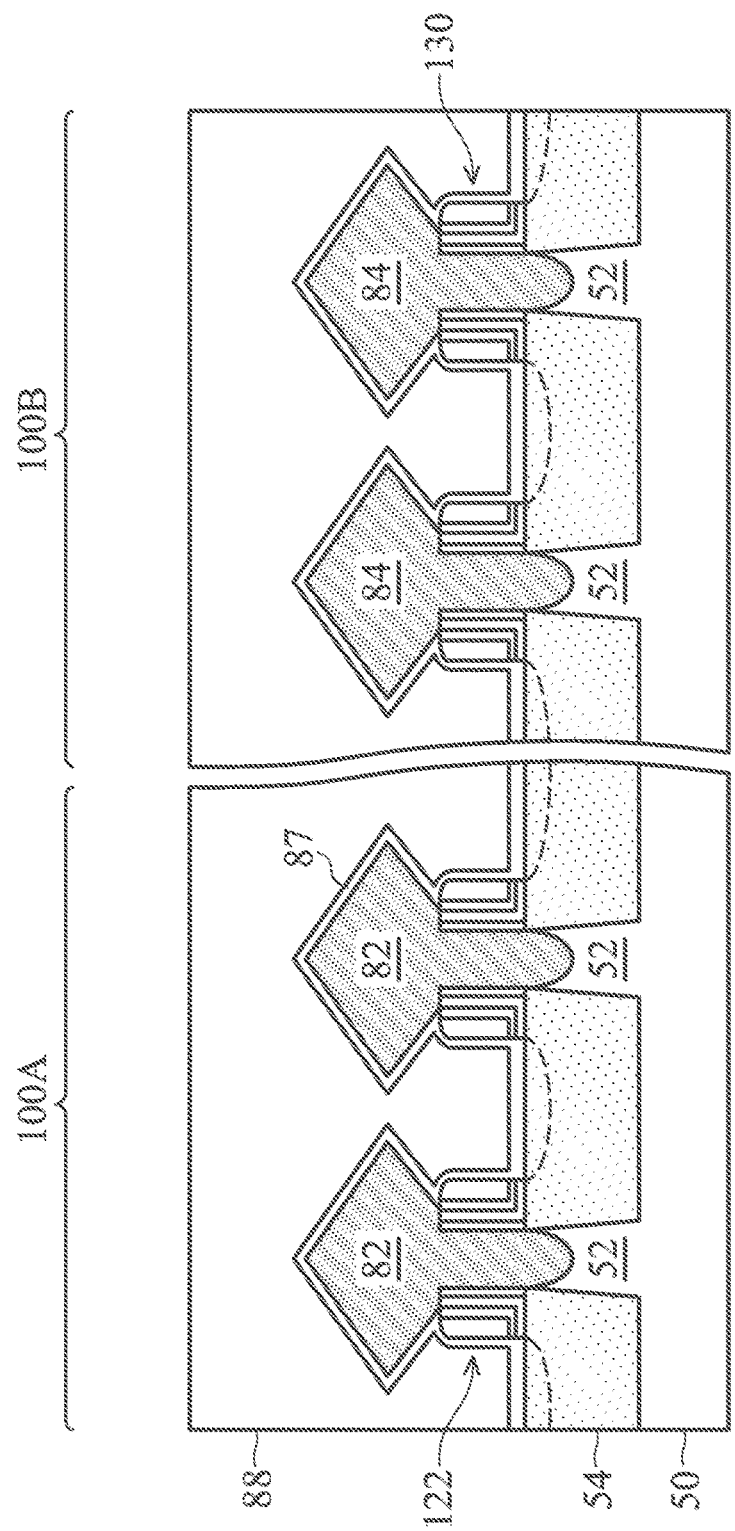

Referring to FIGS. 14A, 14B, and 14C, after forming the epitaxial source/drain regions 82 in the first region 100A, the epitaxial source/drain regions 84 are formed in the second region 100B. In some embodiments, the epitaxial source/drain regions 84 are formed in the second region 100B using similar methods as the epitaxial source/drain regions 82 described above with reference to FIGS. 9A through 14C, and the detailed description is not repeated for the sake of brevity. In some embodiments, during the formation of the epitaxial source/drain regions 84 in the second region 100B, e.g., the PMOS region, the first region 100A, e.g., the NMOS region may be masked (not shown). In some embodiments, the spacer layer 80 in the second region 100B is patterned to form spacers 130 along sidewalls of the dummy gates 76 and the fins 56. The spacer layer 80 in the second region 100B may be patterned using similar methods as the spacer layer 80 in the first region 100A, described above with reference to FIGS. 9A-10C, and the description is not repeated herein for the sake of brevity. Subsequently, the source/drain regions of the fins 56 in the second region 100B are etched to form recesses (shown as filled with the epitaxial source/drain regions 84 in FIGS. 14B and 14C) similar to the V-shaped recesses 126 (See FIGS. 12B, 12C, and 12D). The recesses in the second region 100B may be formed using similar method as the V-shaped recesses 126 in the first region, described above with reference to FIGS. 11A-12D, and the description is not repeated herein for the sake of brevity.

Next, the epitaxial source/drain regions 84 in the second region 100B are epitaxially grown in the recesses using MOCVD, MBE, LPE, VPE, SEG, a combination thereof, or the like. The epitaxial source/drain regions 84 may include any acceptable material, such as any material that is appropriate for p-type FinFETs. For example, if the fin 56 is silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. In the second region 100B, epitaxial source/drain regions 84 are formed in the fins 56 such that each dummy gate 76 is disposed between respective neighboring pairs of the epitaxial source/drain regions 84. In some embodiments epitaxial source/drain regions 84 may extend past the fins 56 and into the semiconductor strips 52.

The material of the epitaxial source/drain regions 84 in the second region 100B may be implanted with dopants, similar to the process previously discussed for forming the LDD regions 79, followed by an anneal (see FIGS. 8A, 8B, and 8C). The source/drain regions 84 may have an impurity concentration in a range from about $10^{19}$ cm$^{-3}$ to about $10^{21}$ cm$^{-3}$. The p-type impurities for the source/drain regions 84 in the second region 100B, e.g., the PMOS region, may be any of the p-type impurities previously discussed. In other embodiments, the epitaxial source/drain regions 84 may be in situ doped during growth. In the illustrated embodiments, each of the source/drain regions 84 is physically separate from other source/drain regions 84. In other embodiments, two or more adjacent source/drain regions 84 may be merged. Such an embodiment is depicted in FIGS. 19A, 19B, and 19C, such that two adjacent source/drain regions 84 are merged to form a common source/drain region. In some embodiments, more than two adjacent source/drain regions 84 may be merged.

Referring further to FIGS. 14A, 14B, and 14C, an etch stop layer 87 and an interlayer dielectric (ILD) 88 are deposited over the dummy gates 70 and 76, and over the source/drain regions 82 and 84. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, a combination thereof, or the like. In some embodiments, the etch stop layer 87 is used as a stop layer while patterning the ILD 88 to form openings for subsequently formed contacts. Accordingly, a material for the etch stop layer 87 may be chose such that the material of the etch stop layer 87 has a lower etch rate than the material of ILD 88.

Figure 15A:
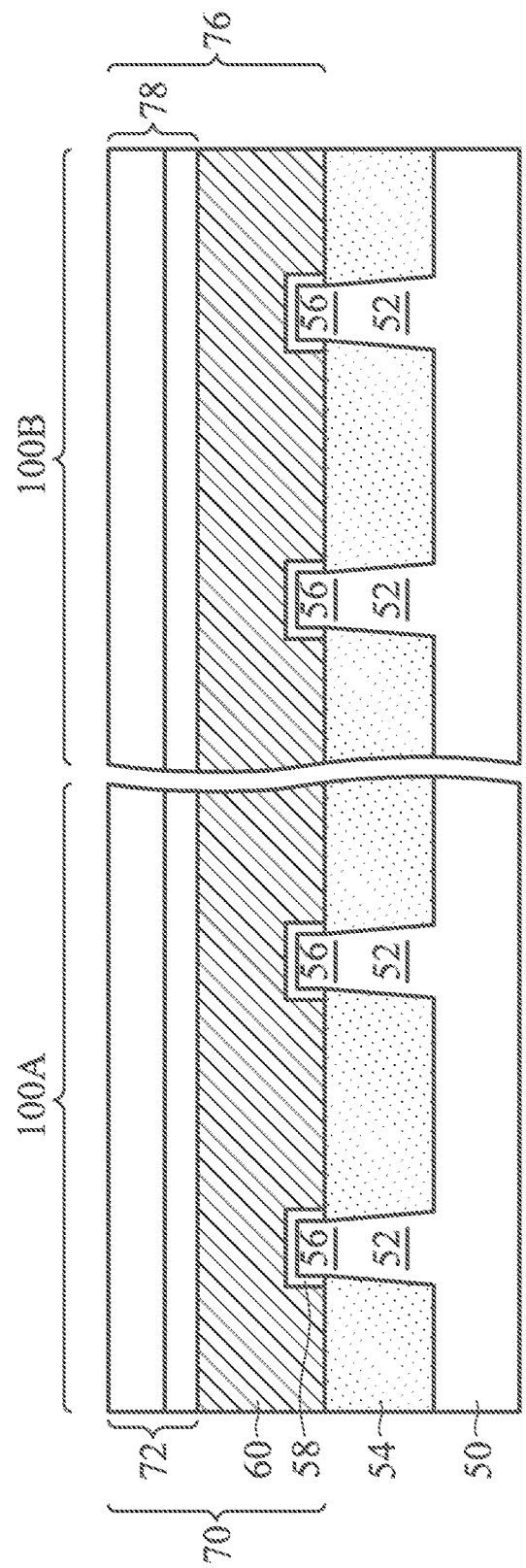
FIGS. 15A, 15B, and 15C are cross-sectional views of intermediate stages in the manufacture of a FinFET device in accordance with some embodiments.
Figure 15B:
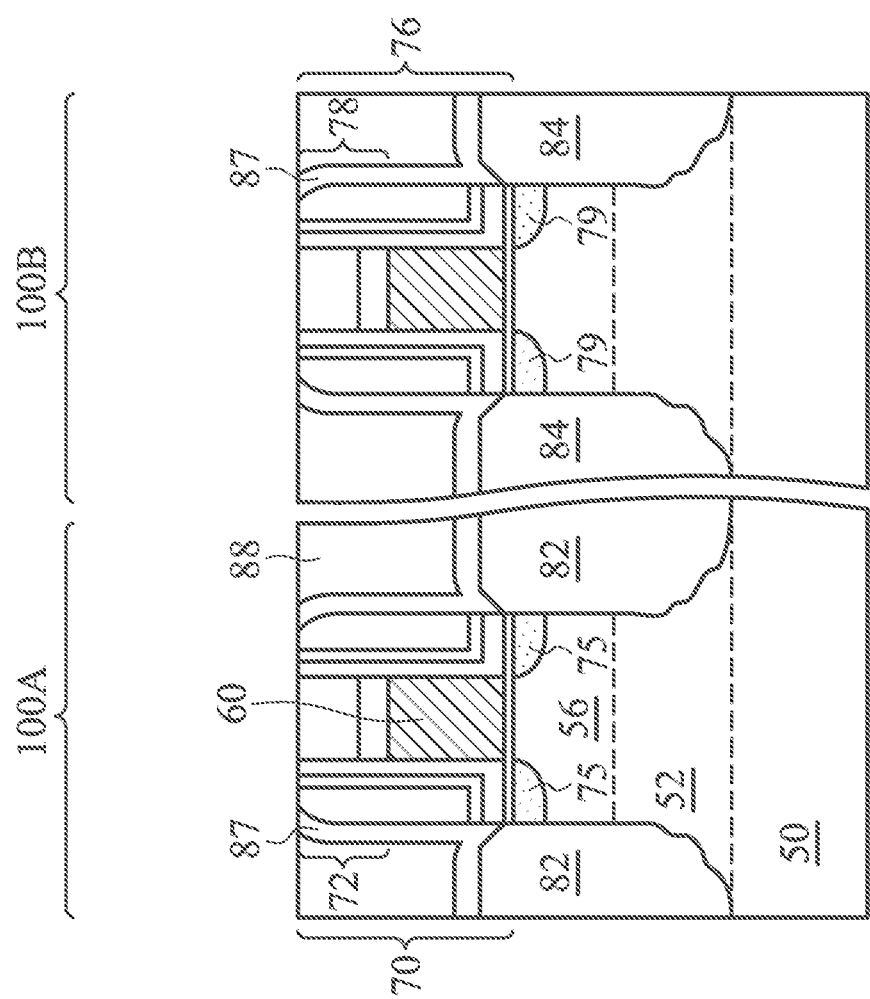
Figure 15C:
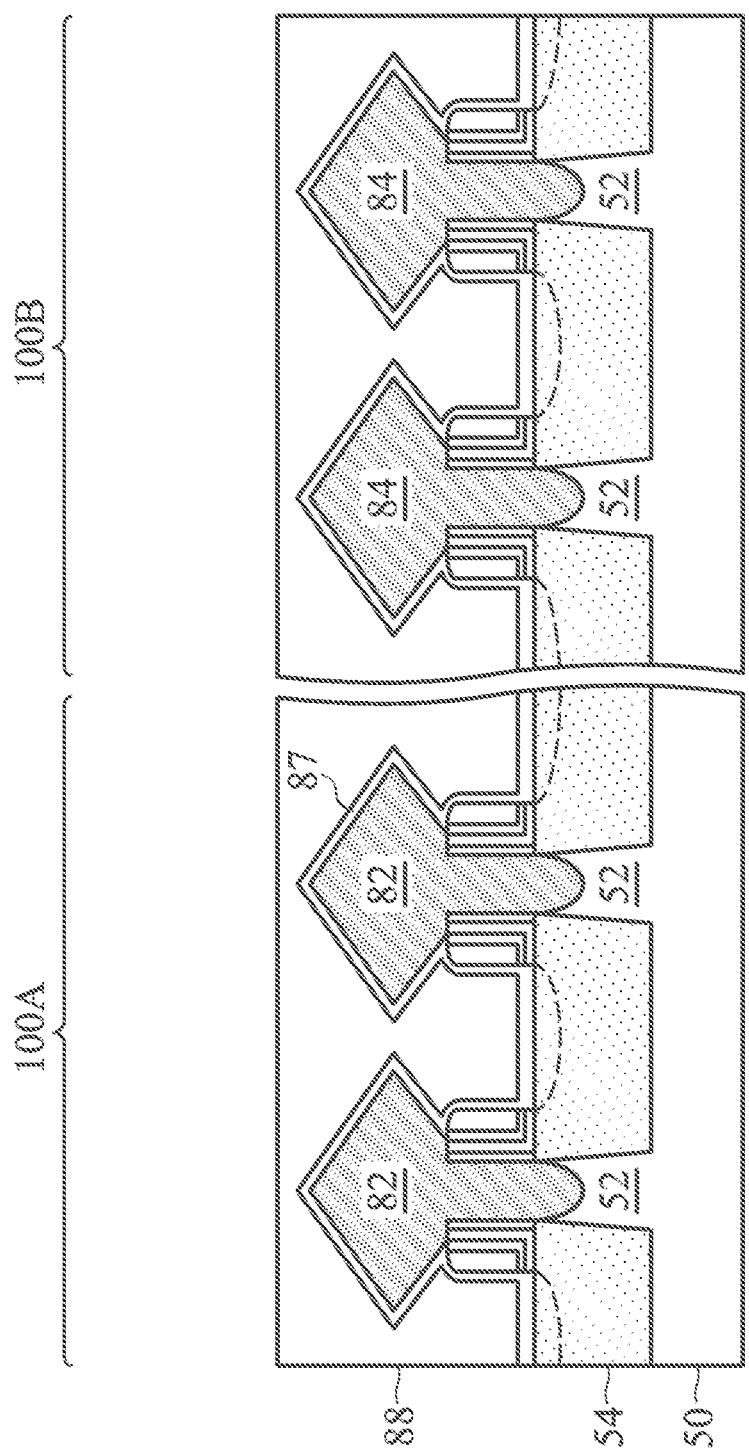

Referring to FIGS. 15A, 15B, and 15C, a planarization process, such as a CMP, may be performed to level the top surface of ILD 88 with the top surfaces of the dummy gates 70 and 76. After the planarization process, top surfaces of the dummy gates 70 and 76 are exposed through the ILD 88. In some embodiments, the CMP may also remove the masks 72 and 78, or portions thereof, on the dummy gates 70 and 76.

Figure 16A:
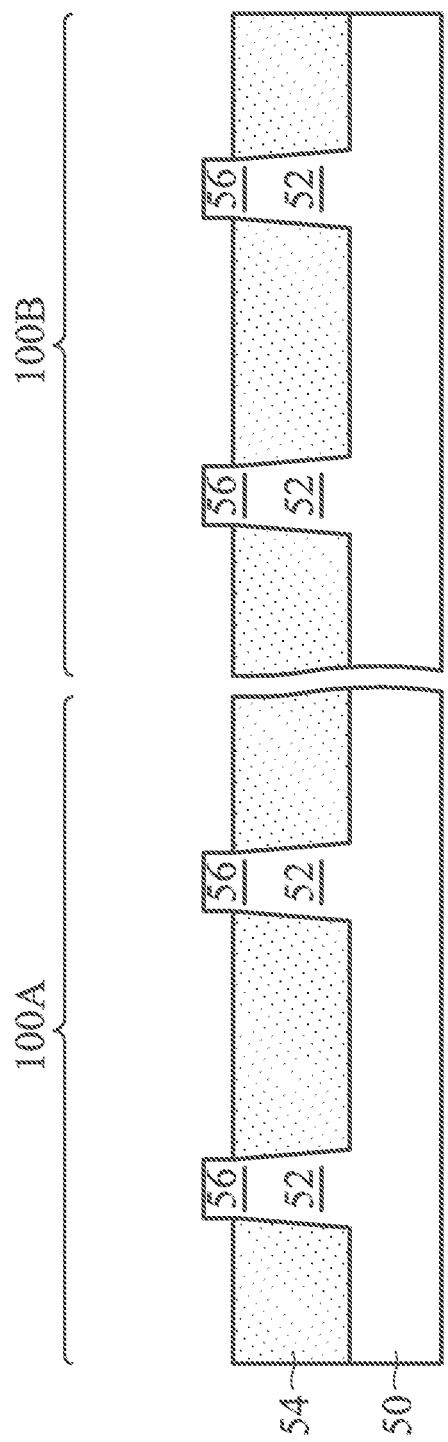
FIGS. 16A, 16B, and 16C are cross-sectional views of intermediate stages in the manufacture of a FinFET device in accordance with some embodiments.
Figure 16B:
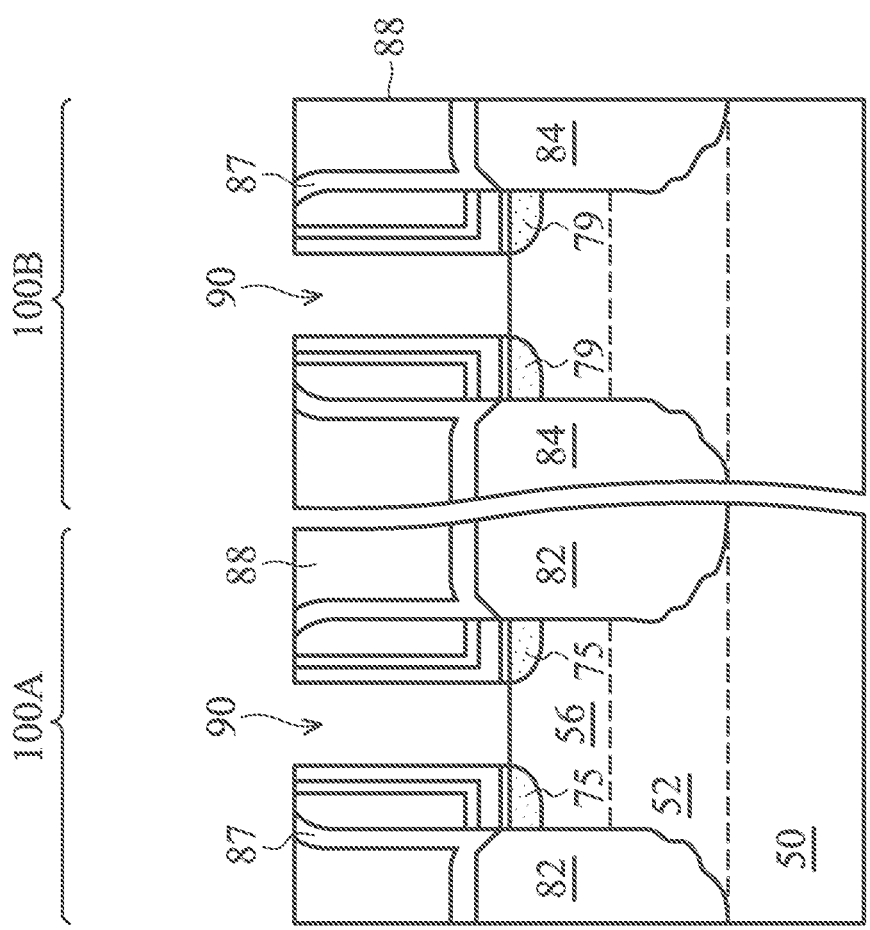
Figure 16C:
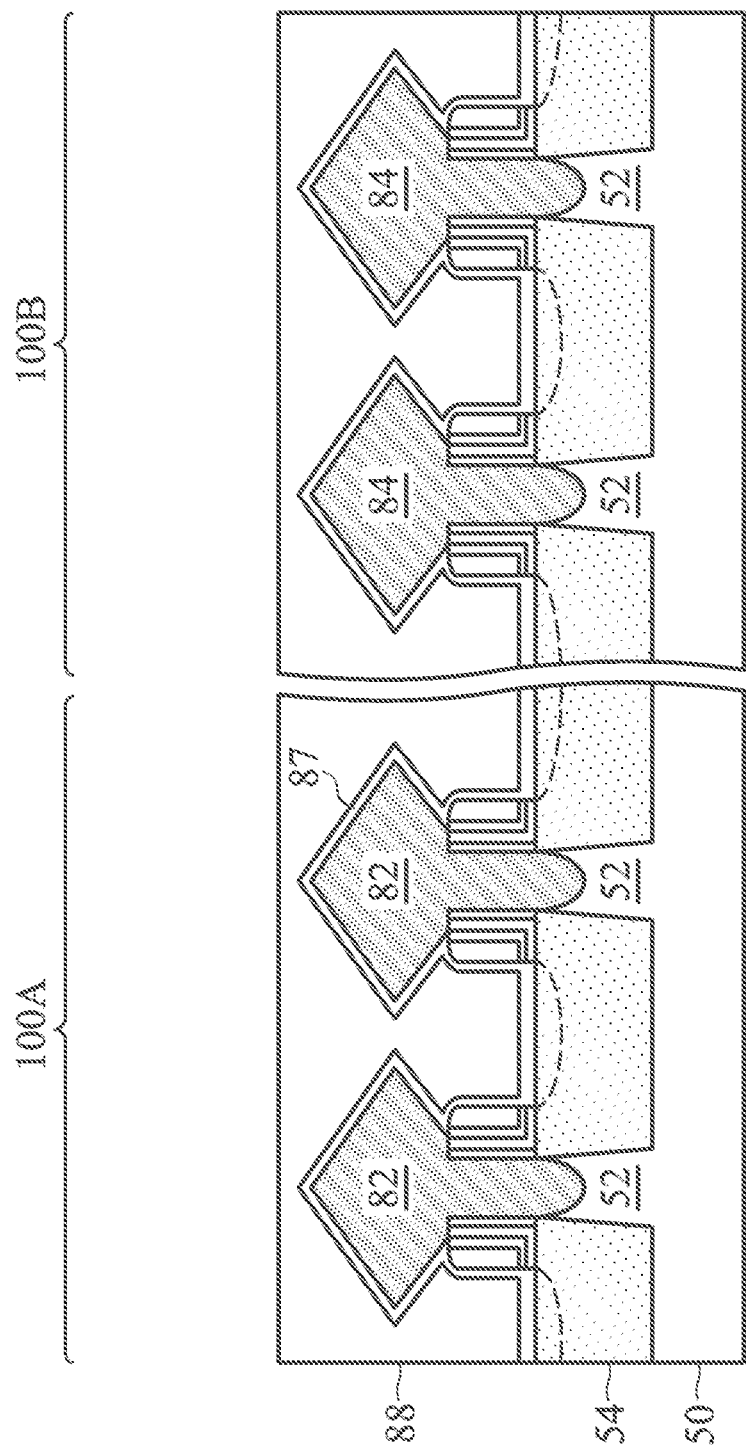

Referring to FIGS. 16A, 16B, and 16C, remaining portions of masks 72 and 78 and the dummy gates 70 and 76 are removed in an etching step(s), so that recesses 90 are formed. Each of the recesses 90 exposes a channel region of a respective fin 56. Each channel region is disposed between neighboring pairs of the epitaxial source/drain regions 82 in the first region 100A or between neighboring pairs of the epitaxial source/drain regions 84 in the second region 100B. During the removal, the dummy dielectric layer 58 may be used as an etch stop layer when the dummy gates 70 and 76 are etched. The dummy dielectric layer 58 may then be removed after the removal of the dummy gates 70 and 76.

Figure 17A:
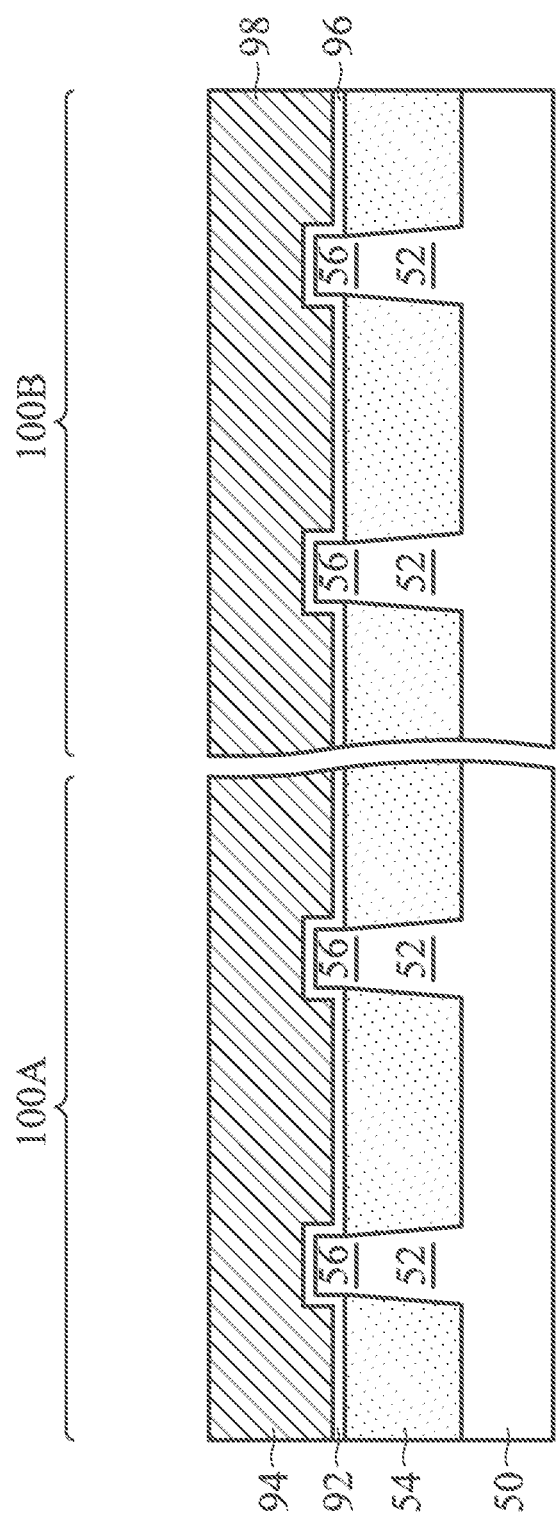
FIGS. 17A, 17B, and 17C are cross-sectional views of intermediate stages in the manufacture of a FinFET device in accordance with some embodiments.
Figure 17B:
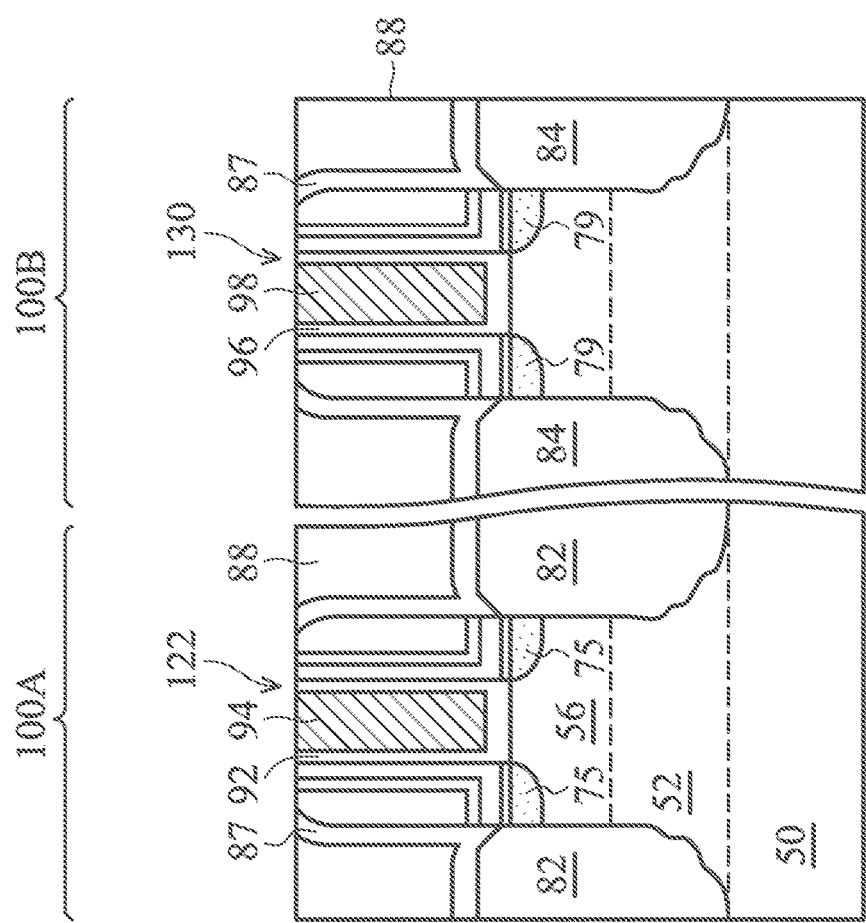
Figure 17C:
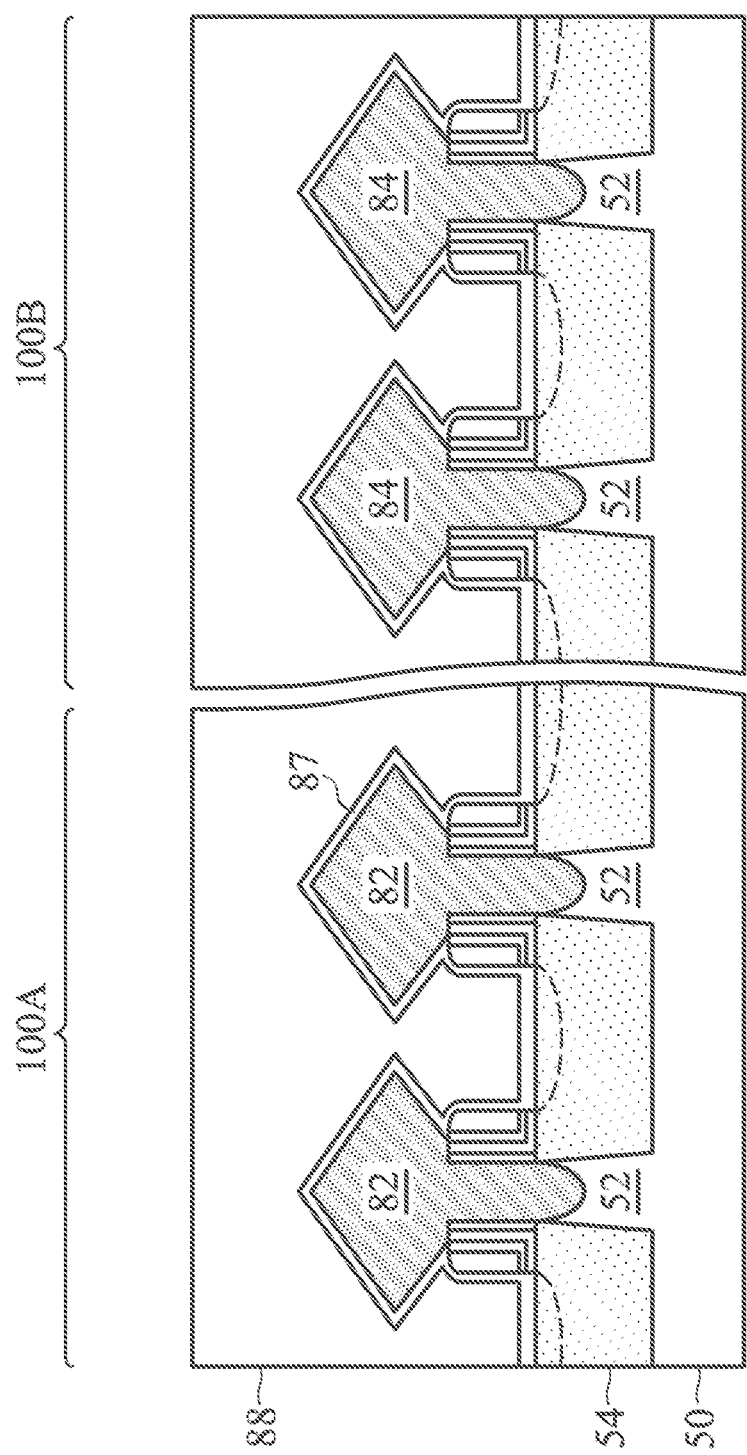

Referring to FIGS. 17A, 17B, and 17C, gate dielectric layers 92 and 96, and gate electrodes 94 and 98 are formed for replacement gates in the first region 100A and the second region 100B, respectively. The gate dielectric layers 92 and 96 are deposited conformally in the recesses 90, such as on the top surfaces and the sidewalls of the fins 56, on sidewalls of the gate spacers 122 and 130, respectively, and on a top surface of the ILD 88. In some embodiments, the gate dielectric layers 92 and 96 comprise silicon oxide, silicon nitride, or multilayers thereof. In other embodiments, the gate dielectric layers 92 and 96 include a high-k dielectric material, and in these embodiments, the gate dielectric layers 92 and 96 may have a k value greater than about 7.0, and may include a metal oxide or a silicate of Hf, Al, Zr, La, Mg, Ba, Ti, Pb, and combinations thereof. The formation methods of the gate dielectric layers 92 and 96 may include Molecular-Beam Deposition (MBD), ALD, PECVD, a combination thereof, or the like.

Next, the gate electrodes 94 and 98 are deposited over the gate dielectric layers 92 and 96, respectively, and fill the remaining portions of the recesses 90. The gate electrodes 94 and 98 may be made of a metal-containing material such as TiN, TaN, TaC, Co, Ru, Al, Ag, Au, W, Ni, Ti, Cu, combinations thereof, or multi-layers thereof. After the filling of the gate electrodes 94 and 98, a planarization process, such as a CMP, may be performed to remove the excess portions of the gate dielectric layers 92 and 96, and the gate electrodes 94 and 98, which excess portions are over the top surface of ILD 88. The resulting remaining portions of material of the gate electrodes 94 and 98, and the gate dielectric layers 92 and 96 thus form replacement gates of the resulting FinFETs.

In some embodiments, the formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 18A:
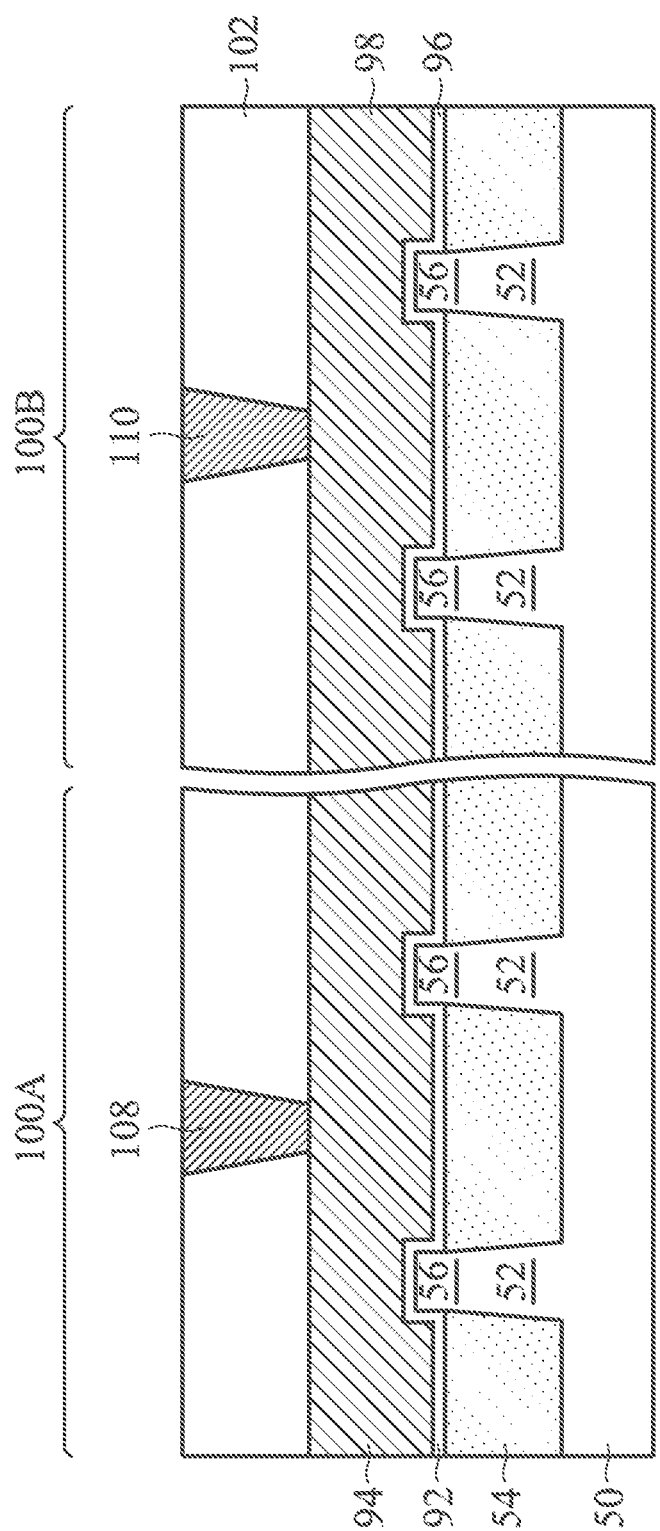
FIGS. 18A, 18B, and 18C are cross-sectional views of intermediate stages in the manufacture of a FinFET device in accordance with some embodiments.
Figure 18B:
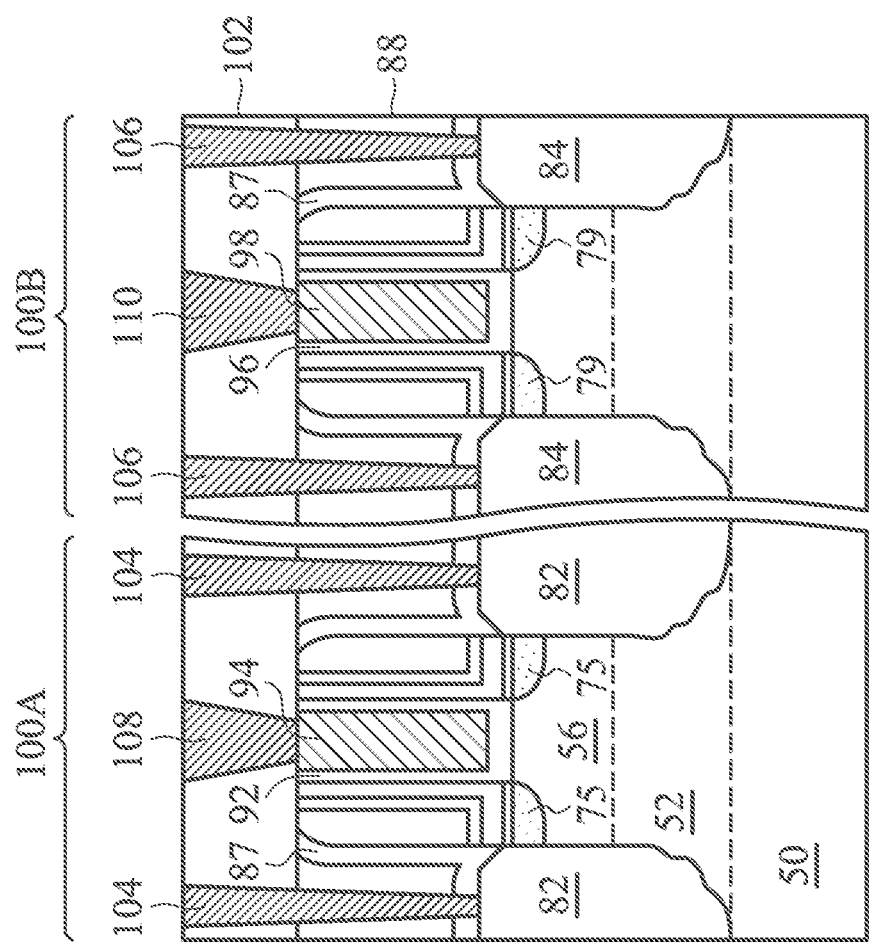
Figure 18C:
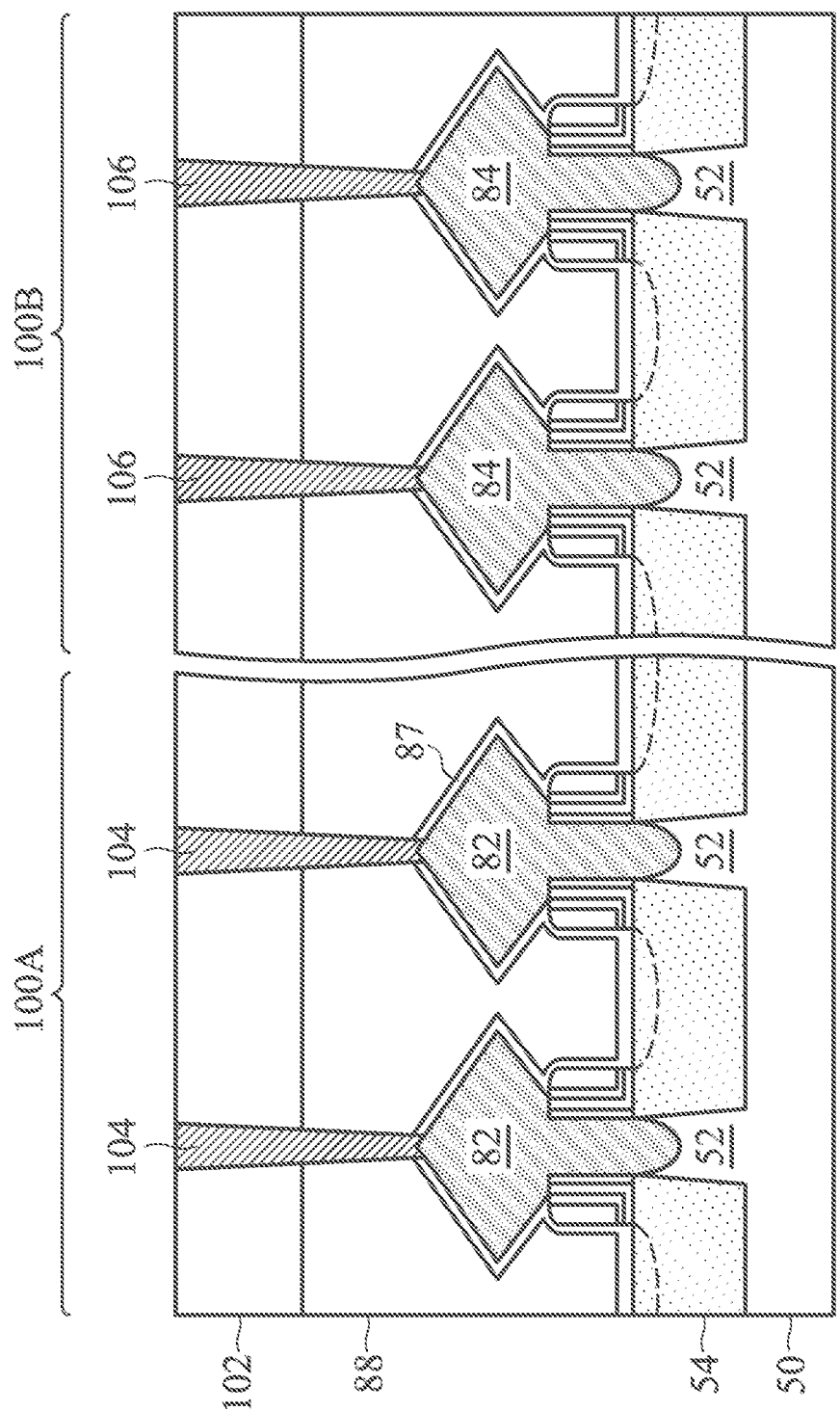

Referring to FIGS. 18A, 18B, and 18C, an ILD 102 is deposited over the ILD 88, contacts 104 and 106 are formed through the ILD 102 and the ILD 88, and contacts 108 and 110 are formed through the ILD 102. In an embodiment, the ILD 102 is formed using similar materials and methods as ILD 88, described above with reference to FIGS. 14A, 14B, and 14C, and the description is not repeated herein for the sake of brevity. In some embodiments, the ILD 102 and the ILD 88 are formed of a same material. In other embodiments, the ILD 102 and the ILD 88 are formed of different materials.

Openings for the contacts 104 and 106 are formed through the ILDs 88 and 102, and the etch stop layer 87. Openings for the contacts 108 and 110 are formed through the ILD 102 and the etch stop layer 87. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess materials from a top surface of the ILD 102. The remaining liner and conductive material form contacts 104, 106, 108, and 110 in the openings. An anneal process may be performed to form a silicide (not shown) at the interface between the epitaxial source/drain regions 82 and 84 and the contacts 104 and 105, respectively. The contacts 104 are physically and electrically coupled to the epitaxial source/drain regions 82, the contacts 106 are physically and electrically coupled to the epitaxial source/drain regions 84, the contact 108 is physically and electrically coupled to the gate electrode 94, and the contact 110 is physically and electrically coupled to the gate electrode 98. While the contacts 104 and 106 are depicted in FIG. 18B in a same cross-section as the contacts 108 and 110, this depiction is for purposes of illustration and in some embodiments the contacts 104 and 106 are disposed in different cross-sections from contacts 108 and 110.

FIGS. 19A, 19B, and 19C illustrated cross-sectional views of a FinFET device that is similar to the FinFET device illustrated in FIGS. 18A, 18B, and 18C, with like elements labeled with like numerical references. In some embodiments, the FinFET device of FIGS. 19A, 19B, and 19C may be formed using similar materials and methods and FinFET device of FIGS. 18A, 18B, and 18C, described above with reference to FIGS. 1-18C, and the description is not repeated herein for the sake of brevity. In the illustrated embodiment, two adjacent source/drain regions 82 and two adjacent source/drain regions 84 are merged to form respective common source/drain regions. In other embodiments, more than two adjacent source/drain regions 82 and more than two adjacent source/drain regions 84 may be merged.

Figure 20:
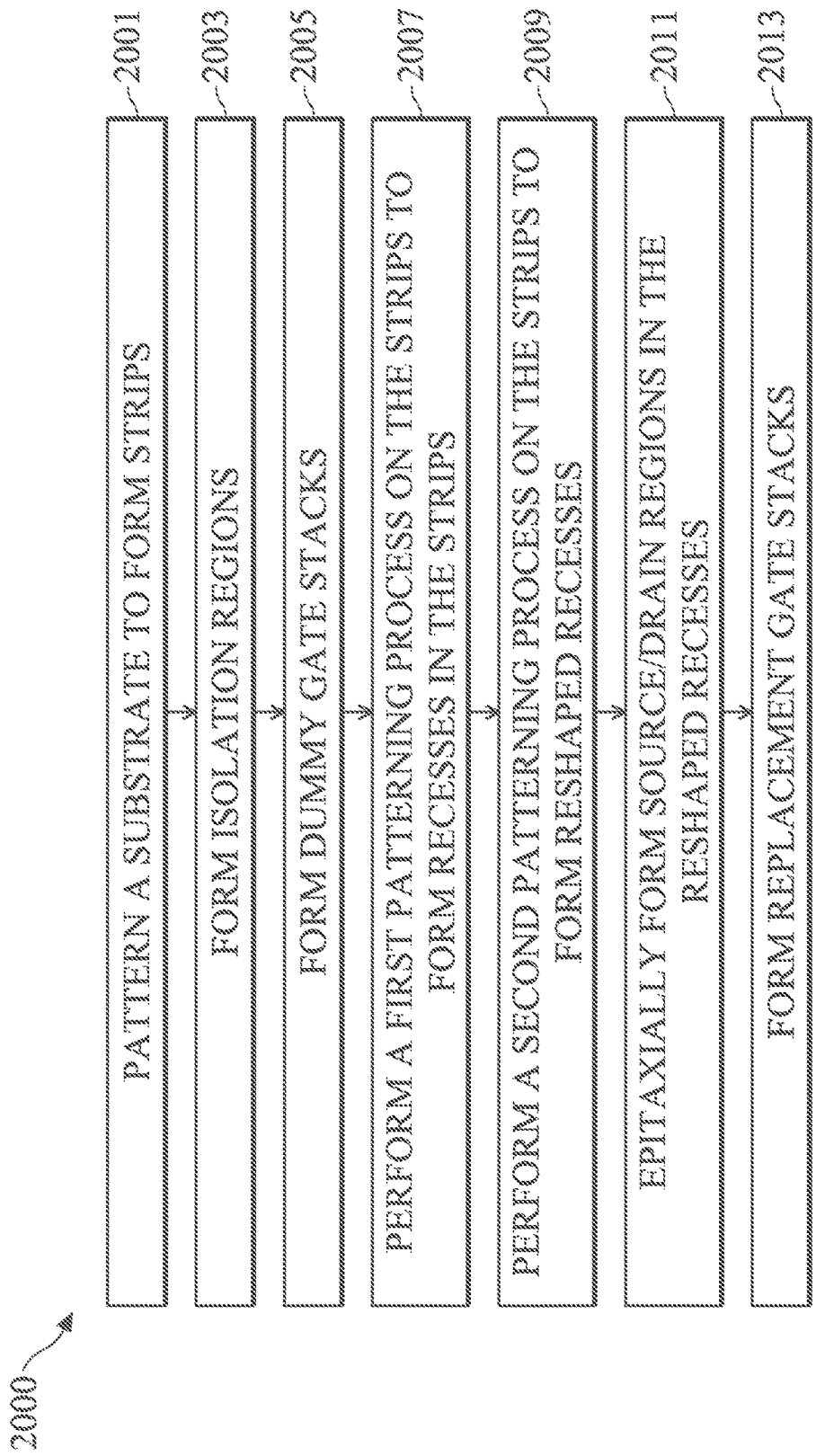
FIG. 20 is a flow diagram illustrating a method of forming a FinFET device in accordance with some embodiments.

FIG. 20 is a flow diagram illustrating a method of forming a FinFET device in accordance with some embodiments. The method 2000 starts with step 2001, where a substrate (such as the substrate 50 illustrated in FIG. 2A) is patterned to form strips (such as the semiconductor strips 52 illustrated in FIG. 3A) as described above with reference to FIGS. 2A and 3A. In step 2003, isolation regions (such as the isolation regions 54 illustrated in FIG. 5A) are formed between adjacent strips as described above with reference to FIGS. 4A and 5A. In step 2005, dummy gate stacks (such as the dummy gates 70 and 76 illustrated in FIGS. 7A and 7B) are formed over the strips as described above with reference to FIGS. 6A, 6B, and 7A-7C. In step 2007, a first patterning process is performed on the strips to form recesses (such as the recesses 124 illustrated in FIGS. 11B and 11C) in the strips as described above with reference to FIGS. 8A-11C. In step 2009, a second patterning process is performed on the strips to form reshaped recesses (such as the recesses 126 illustrated in FIGS. 12B-12D) in the strips as described above with reference to FIGS. 12A-12D. In step 2011, source/drain regions (such as the epitaxial source/drain regions 82 illustrated in FIGS. 13B and 13C) are epitaxially grown in the reshaped recesses as described above with reference to FIGS. 13A-13D. In some embodiments, steps 2007, 2009, and 2011 are performed on strips disposed in a first region of the substrate where n-type devices are formed. In such embodiments, steps 2007, 2009, and 2011 may be repeated to be performed on strips disposed in a second region of the substrate where p-type devices are formed as described above with reference to FIGS. 14A-14C. In step 2013, replacement gate stacks (such as the gate dielectric layers 92/the gate electrodes 94 and the gate dielectric layers 96/the gate electrodes 98 illustrated in FIGS. 17A and 17B) are formed over the strips as described above with reference to FIGS. 15A-17C.

Various embodiments discussed herein allow for reducing the number of misfit dislocations in source/drain regions, and preventing the relaxation of the source/drain regions through the formation of misfit dislocations. By forming non-relaxed source/drain regions, stress characteristics of source/drain regions are improved, which improves performance characteristics of the resulting FinFET device. Furthermore, by reducing the number of misfit dislocations in the source/drain regions, the yield of the known good devices is improved.

According to an embodiment, a method includes forming a fin over a substrate. An isolation region is formed adjacent the fin. A dummy gate structure is formed over the fin. The fin adjacent the dummy gate structure is recessed to form a first recess. The first recess has a U-shaped bottom surface. The U-shaped bottom surface is below a top surface of the isolation region. The first recess is reshaped to form a reshaped first recess. The reshaped first recess has a V-shaped bottom surface. At least a portion of the V-shaped bottom surface includes one or more steps. A source/drain region is epitaxially grown in the reshaped first recess.

According to another embodiment, a method includes patterning a substrate to form a strip, the strip comprising a first semiconductor material. An isolation region is formed along a sidewall of the strip. An upper portion of the strip extends above a top surface of the isolation region. A dummy gate structure is formed along sidewalls and a top surface of the upper portion of the strip. An anisotropic etching process is performed on an exposed portion of the upper portion of the strip to form a first recess. The exposed portion of the strip is not covered by the dummy gate structure. An isotropic etching process is performed on sidewalls and a bottom surface of the first recess to form a reshaped first recess. A bottom surface of the reshaped first recess has one or more steps. A source/drain region is epitaxially grown in the reshaped first recess. The source/drain region includes a second semiconductor material different from the first semiconductor material.

According to yet another embodiment, a device includes a fin over a substrate, an isolation region adjacent the fin, a gate structure along sidewalls and over a top surface of a channel region of the fin, and an epitaxial region over the fin adjacent the gate structure. The epitaxial region has a V-shaped bottom surface. At least a portion of the V-shaped bottom surface has a stair-like pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin over a substrate;
    forming an isolation region adjacent the fin;
    forming a dummy gate structure over the fin;
    recessing the fin adjacent the dummy gate structure to form a first recess, the first recess having a U-shaped bottom surface, the U-shaped bottom surface being below a top surface of the isolation region;
    reshaping the first recess to form a reshaped first recess, the reshaped first recess having a V-shaped bottom surface, at least a portion of the V-shaped bottom surface comprising one or more steps; and
    epitaxially growing a source/drain region in the reshaped first recess.

2. The method of claim 1, wherein recessing the fin comprises performing a first etching process on the fin.

3. The method of claim 2, wherein the first etching process is an anisotropic dry etching process.

4. The method of claim 2, wherein the first etching process physically etches a material of the fin.

5. The method of claim 2, wherein reshaping the first recess comprises performing a second etching process on the fin, the second etching process being different from the first etching process.

6. The method of claim 5, wherein the second etching process is an isotropic dry etching process.

7. The method of claim 5, wherein the second etching process chemically etches a material of the fin.

8. The method of claim 1, wherein reshaping the first recess further comprises removing a damaged material along sidewalls and the U-shaped bottom surface of the first recess.

9. The method of claim 1, wherein epitaxially growing the source/drain region in the reshaped first recess comprises epitaxially growing a first semiconductor material in the reshaped first recess, the first semiconductor material being different from a second semiconductor material of the fin.

10. A method comprising:
  patterning a substrate to form a strip, the strip comprising a first semiconductor material;
  forming an isolation region along a sidewall of the strip, an upper portion of the strip extending above a top surface of the isolation region;
  forming a dummy gate structure along sidewalls and a top surface of the upper portion of the strip;
  performing an anisotropic etching process on an exposed portion of the upper portion of the strip to form a first recess, the exposed portion of the strip being not covered by the dummy gate structure;
  performing an isotropic etching process on sidewalls and a bottom surface of the first recess to form a reshaped first recess, a bottom surface of the reshaped first recess having one or more steps; and
  epitaxially growing a source/drain region in the reshaped first recess, the source/drain region comprising a second semiconductor material different from the first semiconductor material.

11. The method of claim 10, wherein performing the isotropic etching process further comprises removing a damaged material along the sidewalls and the bottom surface of the first recess.

12. The method of claim 10, wherein the anisotropic etching process physically etches the first semiconductor material.

13. The method of claim 10, wherein the anisotropic etching process etches the first semiconductor material by ion bombardment.

14. The method of claim 10, wherein the isotropic etching process chemically etches the first semiconductor material using radicals.

15. The method of claim 10, further comprising forming spacers on sidewalls of the dummy gate structure and on sidewalls of the exposed portion of the upper portion of the strip.

16. The method of claim 10, wherein the bottom surface of the reshaped first recess is below the top surface of the isolation region.

17. A device comprising:
  a fin over a substrate;
  an isolation region adjacent the fin;
  a gate structure along sidewalls and over a top surface of a channel region of the fin; and
  an epitaxial region over the fin adjacent the gate structure, the epitaxial region having a V-shaped bottom surface, at least a portion of the V-shaped bottom surface having a stair-like pattern.

18. The device of claim 17, wherein the stair-like pattern comprises one or more steps.

19. The device of claim 17, wherein the V-shaped bottom surface of the epitaxial region is below a top surface of the isolation region.

20. The device of claim 17, wherein the fin comprises a first semiconductor material and the epitaxial region comprises a second semiconductor material, the second semiconductor material being different from the first semiconductor material.

* * * * *